United States Patent [19]
Memida

[11] Patent Number: 6,137,360
[45] Date of Patent: Oct. 24, 2000

[54] DIFFERENTIAL AMPLIFIER AND VOLTAGE FOLLOWER CIRCUIT

[75] Inventor: Yuuichi Memida, Kitakatsuragi-gun, Japan

[73] Assignee: Sharp Kabushiki Kaisha, Osaka, Japan

[21] Appl. No.: 08/935,904

[22] Filed: Sep. 23, 1997

[30] Foreign Application Priority Data

Nov. 8, 1996 [JP] Japan .................................. 8-296867
Feb. 25, 1997 [JP] Japan .................................. 9-040994

[51] Int. Cl.$^7$ ........................................................ H03F 3/45
[52] U.S. Cl. ........................................ 330/253; 330/257
[58] Field of Search ................................... 330/252, 253, 330/255, 257, 261

[56] References Cited

U.S. PATENT DOCUMENTS

| | | | |
|---|---|---|---|
| 4,760,346 | 7/1988 | Kultgen et al. | 330/147 X |
| 5,604,464 | 2/1997 | Hwang et al. | 330/253 |
| 5,764,101 | 6/1998 | Archer | 330/253 |

FOREIGN PATENT DOCUMENTS 292008  3/1990  Japan .

OTHER PUBLICATIONS

Schilling et al., *Electronic Circuits, Discrete and Integrated*, 2nd ed., McGraw–Hill, 1979, pp. 355–6.

*Primary Examiner*—Steven J. Mottola

[57] ABSTRACT

A differential input comparison circuit of an operational amplifier circuit includes first and second input circuits having circuit structures based on a single input direction of an N channel. To a pair of input transistors of the first input circuit, a non-inverting input and an inverting input are directly applied, while to a pair of input transistors of the second input transistor, the inputs are applied via respective level shifters. When the inverting input is lowered, a threshold voltage of the pair of input transistors of the first input circuit cannot be ensured. To prevent this, each level shifter starts operating based on an instruction from a switching circuit to shift respective levels of the inputs to ensure the threshold voltage of the pair of input transistors of the second input circuit. As a result, the operational amplifier circuit can compare the inputs without problems, thereby providing a differential amplifier corresponding to a wide dynamic range which permits input/output operation in an entire range of a power source voltage.

20 Claims, 13 Drawing Sheets

HIGH INPUT VOLTAGE:

LOW INPUT VOLTAGE:

DIFFERENTIAL AMPLIFIER AND VOLTAGE FOLLOWER CIRCUIT

FIELD OF THE INVENTION

The present invention relates to a differential amplifier which permits a wide input dynamic range and also relates to a voltage follower circuit adopting such differential amplifier.

BACKGROUND OF THE INVENTION

Conventionally, a differential amplifier has been widely used as an operational amplifier circuit for its beneficial feature that a gain can be maintained constant without being affected by a change in a power source voltage or an ambient temperature if characteristics of the input transistor are uniform. The operational amplifier circuit is used not only as an amplifier but also constituting various circuits such as a voltage follower circuit, a differential integration circuit or a filter, etc.

As shown in FIG. 13, for example, in the arrangement where an operational amplifier circuit 101 is formed on a MOS (Metal Oxide Semiconductor) integrated circuit, the operational amplifier circuit 101 includes a differential input comparison circuit 102 for outputting a comparison current $I_{CMP}$ according to a difference between an non-inverting input voltage $V_{IN1}$ and an inverting input voltage $V_{IN2}$, and an output buffer circuit 103 for outputting an output voltage $V_{OUT}$ according to the comparison current $I_{CMP}$. In an input circuit 104 of the differential input comparison circuit 102, an input transistor N111, i.e., an NMOS transistor, controls a current $I_1$ that flows from a drain to a source in response to the non-inverting input $V_{IN1}$ to be applied to a gate, and an input transistor N112 controls a current flowing therethrough according to the inverting input $V_{IN2}$. To the respective sources of the input transistors N111 and N112 are mutually connected, a predetermined bias current is applied to through a drain of an N-type MOS transistor N103.

Furthermore, to the respective drains of the input transistors N111 and N112, the drains of the P-type MOS transistors P101 and P102 which constitute a current mirror circuit are respectively connected. Additionally, the gate and the drain of the MOS transistor P102 are mutually connected. As a result, the current mirror circuit is operated as an active load, and the MOS transistor P101 outputs a current in the same amount as a current $I_2$ flowing through the input transistor N112 from its drain to the drain of the input transistor N111. On the other hand, as the input transistor N111 absorbs a current $I_1$ in response to the non-inverting input $V_{IN1}$, the comparison current $I_{CMP}$ according to the difference between the currents $I_2$ and $I_1$ is output from a junction of the MOS transistor P101 and the input transistor N111 to the output buffer circuit 103.

On the other hand, the comparison current $I_{CMP}$ is applied to a gate of the P-type MOS transistor P131 provided in the output buffer circuit 103. To the source of the MOS transistor P131, a power source voltage $V_{cc}$ is applied, and to the drain thereof, an N-type MOS transistor N132 is connected as a constant current source for determining a bias current of the output buffer circuit 103. As a result, from a junction between the MOS transistors P131 and N132, an output voltage $V_{OUT}$ according to the comparison current $I_{CMP}$ is output.

In the case of forming a voltage follower circuit of a negative feedback circuit by connecting an output terminal OUT of the operational amplifier circuit 101 to an inverting input terminal IN2, when the non-inverting input $V_{IN1}$ is higher than the output voltage $V_{OUT}$ (inverting input $V_{IN2}$), in the differential input comparison circuit 102, the current $I_1$ flowing in the input transistor N111 becomes greater than the current $I_2$ flowing in the input transistor N112 and exceeds the current $I_2$ to be transmitted to the input transistor N111 via the current mirror circuit composed of the MOS transistors P101 and P102. Therefore, a potential of the junction between the MOS transistors P101 and P102, i.e., a gate potential of the MOS transistor P131 is lowered, and a current flowing in the output buffer circuit 103 increases. As a result, the operational amplifier circuit 101 increases an output voltage $V_{OUT}$ (inverting input $V_{IN2}$). On the other hand, in the case where a non-inverting input $V_{IN1}$ is low, the current $I_1$ flowing through the input transistor N111 becomes lower than the current $I_2$ to be applied from the MOS transistor P101. As a result, in the output buffer circuit 103, a gate potential of the MOS transistor P131 increases, and a current flowing through the MOS transistor P131 decreases. On the other hand, as the MOS transistor N132 is the constant current source, it absorbs a current from the output terminal OUT and lowers the output voltage $V_{OUT}$ (inverting input $V_{IN2}$).

Therefore, in the operational amplifier circuit 101, the output voltage $V_{OUT}$ (inverting input $V_{IN2}$) increases or decreases so as to eliminate a potential difference from the non-inverting input $V_{IN1}$, and the voltages $V_{IN1}$ and $V_{OUT}$ finally become in the same potential. As a result, the operational amplifier circuit 101 can output the same voltage $V_{OUT}$ as the non-inverting input $V_{IN1}$ by converting the impedance of the voltage signal $V_{IN1}$ to be applied to the non-inverting input terminal IN1.

The operational amplifier circuit 101 having the described arrangement operates almost in the same manner even if the polarities of all the transistors inverse. In the following, like the operational amplifier circuit 101, a circuit having N-type input transistors is referred to as a N-channel simple input direction circuit, and like the operational amplifier circuit 111 shown in FIG. 14, a circuit having a P-channel input transistor is referred to as a P-channel simple input direction circuit. Additionally, the operational amplifier circuit 111 has the same arrangement as the operational amplifier circuit 101, except for that respective polarities of all the transistors, areas subjected to an application of the power source voltage $V_{CC}$ and GND inverse.

However, in each of the described arrangements, a range of a common input voltage $V_{IN}$ at which the operational amplifier circuit is operable, i.e., the input dynamic range of the operational amplifier circuit is restricted to be extremely narrow compared with the range of the power source voltage.

A concrete example will be given through an operational amplifier circuit 101 shown in FIG. 13. When the common input voltage $V_{IN}$ of the inputs $V_{IN1} \cdot V_{IN2}$ varies, a source potential of the input transistors N111 and N112 increases or decreases. Therefore, when the common input voltage $V_{IN}$ is lowered, the threshold value voltage $V_{thN}$ of the input transistors N111 and N112 may not be ensured. In this case, the input transistors N111 and N112 become inoperable, and the operational amplifier circuit 101 cannot output the output voltage $V_{OUT}$ according to a difference between the inputs $V_{IN1}$ and $V_{IN2}$. As a result, the input dynamic range of the operational amplifier circuit 101 becomes narrower by the threshold voltage $V_{thN}$ compared with the range of the power source voltage, and the operational amplifier circuit 101 cannot be operated in the case where the common input voltage $V_{IN}$ is in a range of $GND<V_{IN}<V_{thN}$. Similarly, the operational amplifier circuit 111 shown in FIG. 14 is arranged such that the input dynamic range becomes narrower by the threshold value voltage $V_{thP}$ of the input transistors P111 and P112. Therefore, when the common input voltage $V_{IN}$ increases to be fall in the range of $v_{CC}-V_{thP}<V_{IN}<V_{CC}$, an operational amplifier circuit 111 cannot be operated.

For example, in the case of forming each input transistor by the MOS of the enhancement type by a generally used IC manufacturing process, a threshold value voltage becomes around 1V, which cannot be ignored, especially in an operational amplifier circuit that can be operated at a low power source voltage. Therefore, irrespectively of a threshold value voltage of the input transistor, an operational amplifier circuit that can be operated in an entire range of from the GND potential to the power source voltage $V_{CC}$ is strongly demanded.

In the case of forming an input transistor by a transistor that can conduct when a voltage between a gate and a source is 0V, such as a depletion mode MOS transistor, etc., the operational amplifier circuit becomes operable in an entire region from the GND potential to the power source voltage $V_{CC}$. However, in this case, a separate manufacturing process is required in addition to a normal IC manufacturing process, and it becomes difficult to manufacture a high operational amplifier circuit having a high integration.

On the other hand, Japanese Unexamined Patent Publication No. 92008/1990 (Tokukaihei 2-92008) discloses an operational amplifier circuit which is driven bi-directionally as an arrangement which can be manufactured by the normal IC manufacturing process and permits a wide input dynamic range. As shown in FIG. 15, an operational amplifier circuit 121 includes a differential input comparison circuit 122a for outputting a comparison current $I_{CMPb}$ having the same arrangement as the differential input comparison circuit 112 shown in FIG. 14, and an output buffer circuit 123 for generating an output voltage $V_{OUT}$ based on the comparison currents $I_{CMPa}$ and $I_{CMPb}$.

The output buffer circuit 123 has the P-type MOS transistor P131 and the N-type MOS transistor N131 whose drains are respectively connected. The source of the MOS transistor P131 is connected to the power source voltage $V_{CC}$, and the source of the MOS transistor P131 is connected to ground. To the respective gates of the MOS transistors P131 and N131, the comparison currents $I_{CMPa}\cdot I_{CMPb}$ are supplied. As a result, the output buffer circuit 123 synthesizes the comparison currents $I_{CMPa}\cdot I_{CMPb}$ of the differential input comparison circuits 122a and 112b by the push-pull system and the source ground system, and outputs an output voltage $V_{OUT}$. 15. In the described arrangement, the differential input comparison circuits 122a and 122b operate in the range where the common input voltage $V_{IN}$ of the inputs $V_{IN1}$ and $V_{IN2}$ satisfy the range of $V_{thN}<V_{IN}<V_{cc}-V_{thP}$. On the other hand, in the range of $GND<V_{IN}<V_{thN}$, only the differential input comparison circuit 122b operates, an d in a range of $V_{cc}-V_{thP}<V_{IN}<V_{cc}$, only the differential input comparison circuit 122a operates. In the case where one of the differential input comparison circuits 122a and 122b is not operated, between the MOS transistor P131 and the N131 which constitute the output buffer circuit 123, the MOS transistor connected to the differential input comparison circuits 122a and 122b is operated as the other constant current load. Then, the input dynamic range of the operational amplifier circuit 121 is expanded to an entire range of the power source voltage $V_{CC}$.

However, according to the operational amplifier circuit 121, in the output buffer circuit 123, the high level of the output voltage $V_{OUT}$ is restricted by the operable range of the MOS transistor P131, and the low level of the output voltage $V_{OUT}$ is restricted by the operable region of the MOS transistor N131. As a result, a new problem is raised in that the output dynamic range of the operational amplifier circuit 121 becomes narrower.

Especially, in the case of forming the voltage follower circuit of a negative feed back circuit by connecting the output terminal OUT and the inverting input terminal IN2 of the operational amplifier 121, a reduction in an output dynamic range directly causes an input dynamic range to be reduced. Therefore, the operational amplifier circuit 121 does not enable a significant increase in an input dynamic range.

SUMMARY OF THE INVENTION

It is an object of the present invention is to provide a differential amplifier which offers a wide dynamic range, and permits input/output operations in an entire range of a power source voltage and to provide a voltage follower circuit adopting the same.

In order to achieve the above object, a differential amplifier which compares a non-inverting input to be applied to a non-inverting input terminal with an inverting input to be applied to an inverting input terminal is characterized by comprising a differential amplifier section for comparing the inverting input and the non-inverting input when an input voltage is in a predetermined operable region; and a level shifter for shifting respective potentials of the inverting input and the non-inverting input by a predetermined amount to fall in the operable region when the input voltage is in an inoperable region outside the operable region.

Generally, when the differential amplifier section includes a pair of input transistors prepared in the normal process, such as an MOS (Metal Oxide Semiconductor) transistor, etc., a range of an input voltage at which the differential amplifier section is operable, i.e., an operable range is restricted to be narrower than the range of the power source voltage due to a threshold value voltage of a pair or input transistors, etc.

According to the differential amplifier having the described arrangement, when the input voltage is in the operable region, an proper operation of the differential amplifier section can be ensured, and the differential amplifier can compare the non-inverting input with the inverting input without problems. On the other hand, when the input voltage is raised or lowered to outside the operable region, the level shifter shifts the potentials of the respective inputs by a predetermined amount so that the input voltage falls in the operable region. Therefore, as long as the difference between the input voltage and the operable region is within the amount of shifts of the level shifter, the potentials of the inputs can be adjusted to fall in the operable region, and the differential amplifier section can compare the inputs without problems.

Therefore, in the differential amplifier, the operable range of the input voltage, i.e., the input dynamic range can be increased by an amount of shift of the level shifter. Additionally, when input voltage is in the inoperable region, the level shifter applies an input voltage after level shifted to the circuit in the post stage of the level shifter. As a result, these circuits operate in the same manner as the case where the input voltage is increased or decreased by an amount of shift of the level shifter. Therefore, even when these circuits have the same arrangement as the conventional arrangement, the input dynamic range can be increased, thereby providing a differential amplifier which offers a wide dynamic range using a transistor having the same arrangement as the conventional transistor such as a transistor of an enhancement type, etc.

The described differential amplifier may be arranged such that one input section for converting both inputs into a current is provided, and switching elements are provided respectively between the non-inverting input terminal and the input section and between the inverting input terminal and the input section, and between the level shifter and the input section, whereby the switching elements conduct/cut off depending on whether or not the input voltage is an operable region. However, in the described arrangement, the voltage to be applied to the differential amplifier section may be restricted due to a drop in voltage generated in the switching elements.

In order to prevent such problem, it is preferable that the differential amplifier having the described arrangement is further arranged such that the differential amplifier section includes a first input section having a first input transistor for controlling an amount of current flowing therethrough based on the non-inverting input and a second input transistor for controlling an amount of current flowing therethrough based on the inverting input, a second input section having third and fourth input transistors for controlling respective amounts of currents flowing therethrough based on the non-inverting input and the inverting input to be applied through the level shifter, the third and fourth input transistors respectively having the same polarities as the first and second input transistors; and an output section for outputting a voltage according to a difference between a sum of currents flowing through the first and third input transistors and a sum of currents flowing through the second and fourth input transistors, wherein each level shifter shifts both of the inverting input and the non-inverting input in a direction of increasing currents flowing in the third and fourth input transistors.

According to the described arrangement, as long as at least one of the input section operates, a voltage according to a difference between the non-inverting input and the inverting input can be output. Additionally, to the first and second input transistors, respective in put terminals can be directly connected, a switching element, etc., can be eliminated, and an input dynamic range is not restricted due to a drop in voltage of the switching element, thereby achieving a differential amplifier having a wide input dynamic range.

Additionally, as each input transistor has the same polarity, the current flows in th e same direction, and a sum of currents can be obtained by connecting the corresponding terminals of the input transistors.

It is further preferable that the differential amplifier having the described arrangement includes third and fourth out put transistors for driving outputs in mutually different directions in response to a comparison current indicative of the difference in an amount of currents; and a driving circuit for driving at least one of the third output transistor and the fourth output transistor based on the comparison current.

According to the described arrangement, the output section can drive the output bi-directionally based on a single comparison current, thereby achieving a differential amplifier which offers a wide input/output dynamic range without having deviations in output driving capacity. Furthermore, the differential amplifier can drive the load of the differential amplifier without charging/discharging beforehand. As a result, the circuit for charging/discharging as well as a signal line for instructing to the circuit can be eliminated, thereby permitting a simplified circuit structure. Additionally, as a time for charging/discharging can be eliminated, the differential amplifier can be driven at a still higher speed.

Further, in addition to each of the described arrangements, it is preferable that the differential amplifier further includes a selection circuit for selectively operating the first and second input sections based on whether or not the input voltage is in an operable region.

According to the described arrangement, only one of the input sections operates based on an instruction from the selective circuit. As a result, compared with the case of operating the input sections simultaneously, the power consumption of the differential amplifier can be reduced. Further, when the operation of one of the input sections is unstable such as the case where the input voltage is at the boundary of the range at which the input section can operate properly, the selective circuit is permitted to operate the other input section, thereby permitting still improved characteristics of the differential amplifier.

The described beneficial feature of increased operable range enables the differential amplifiers having the described arrangements to be suitably applied to various circuits. Examples of suitable applications of such differential amplifiers include a voltage follower circuit having a negative feed back circuit formed by connecting the non-inverting input terminal and the output terminal of the differential amplifier.

Conventional bi-directional differential amplifiers suffer from restricted output dynamic range due to an output voltage generated by a push-pull system. Therefore, in the case of forming the voltage follower circuit of the negative feed back circuit by connecting the inverting input terminal and the output terminal, the input dynamic range is restricted.

In contrast, as the differential amplifier in accordance with the present invention is designed for a single input direction, the output dynamic range is not restricted, thereby achieving a voltage follower circuit which offers a wider dynamic range than that adopting the conventional differential amplifier.

For a fuller understanding of the nature and advantages of the invention, reference should be made to the ensuing detailed description taken in conjunction with the accompanying drawings.

DESCRIPTION OF THE EMBODIMENTS

[First Embodiment]

Referring to FIG. 1 through FIG. 6, the following description will explain one embodiment of the present invention. Here, as an example of a differential amplifier in accordance with the present embodiment, a CMOS (Complementary MOS) operational amplifier circuit constituted by an MOS (Metal Oxide Semiconductor) transistor of an enhancement type is adopted, and is used in, for example, a TFT (Thin-Film-Transistor) liquid crystal driver.

Figure 2:
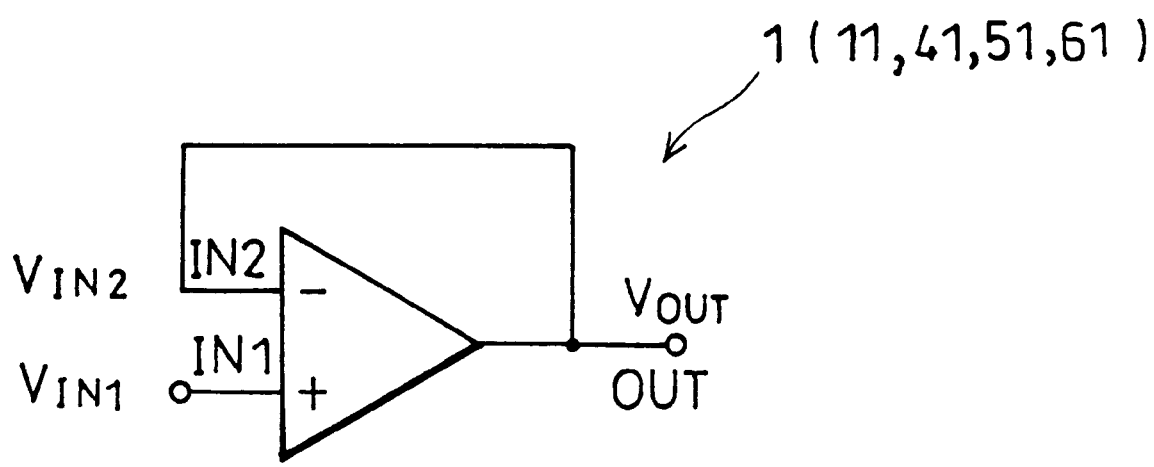
FIG. 2 is a circuit diagram showing a voltage follower circuit formed by using the operational amplifier circuit.

As shown in FIG. 2, the operational amplifier circuit 1 includes a non-inverting input terminal IN1 and an inverting input terminal IN2, and can output from its output terminal a voltage $V_{OUT}$ corresponding to a difference between the input voltages $V_{IN1}$ and $V_{IN2}$ to be applied respectively to both terminals IN1 and IN2. Furthermore, in the present embodiment, the output terminal OUT and the inverting input terminal IN2 of the operational amplifier circuit 1 are connected to form a voltage follower circuit of the negative feed back circuit. The voltage follower circuit is widely used, for example, in a liquid crystal driving circuit, etc. The voltage follower circuit can output the same voltage $V_{OUT}$ as the non-inverting input $V_{IN1}$ by applying an impedance conversion of the voltage signal $V_{IN1}$ to be input to the non-inverting input terminal IN1.

Figure 1:
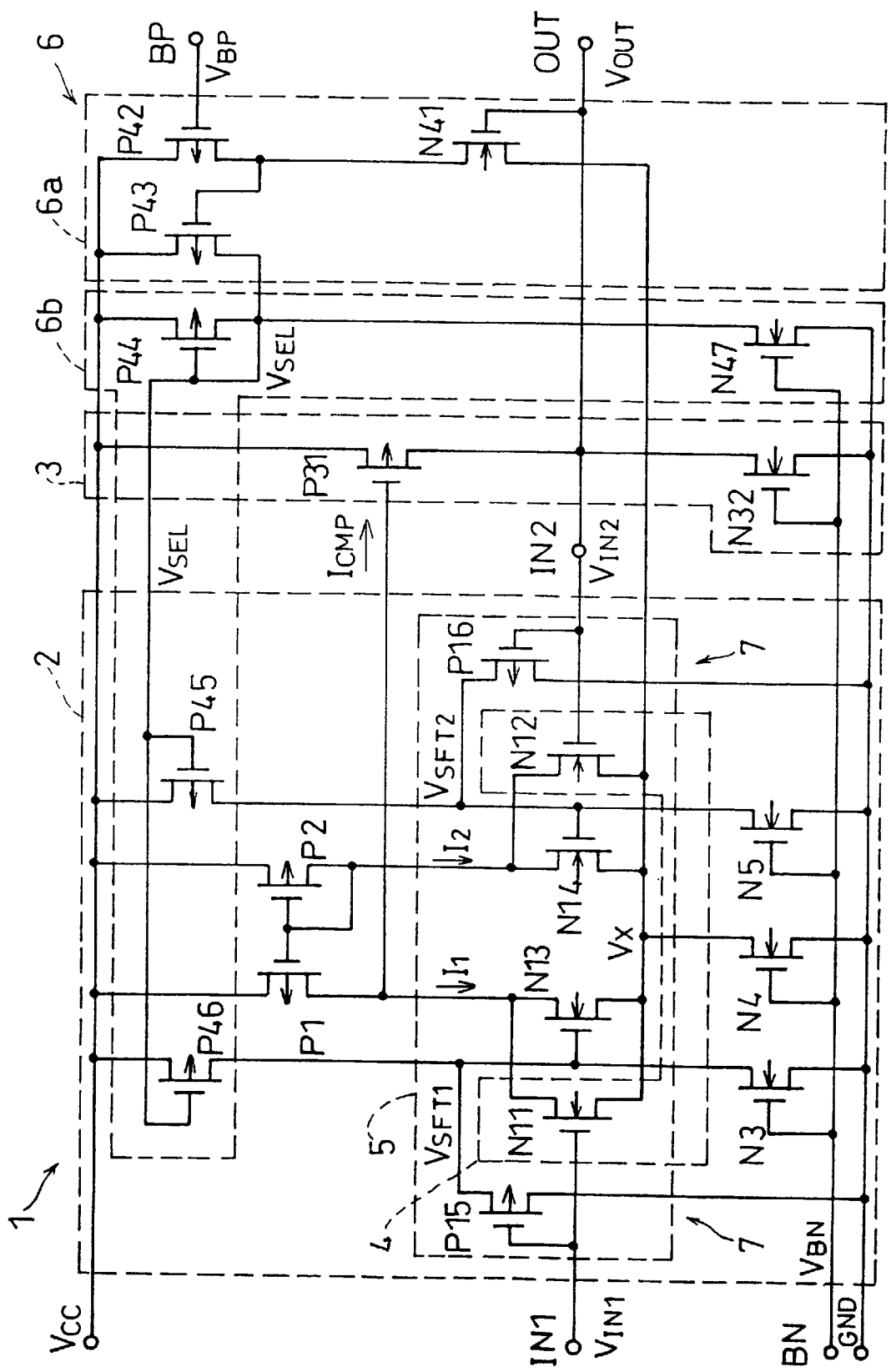
FIG. 1 is a circuit diagram which shows essential parts of an operational amplifier circuit in detail in accordance with one embodiment of the present invention.

In the following, the circuit structure of the operational amplifier circuit 1 will be described in detail in reference to FIG. 1. FIG. 1 shows an example arrangement wherein an NMOS transistor is adopted for input transistors (N11 through N14) wherein a non-inverting input $V_{IN1}$ and an inverting input $V_{IN2}$ are converted into currents $I_1$ and $I_2$ respectively.

The operational amplifier circuit 1 includes a differential input comparison circuit (differential amplifier) 2 for outputting a comparison current $I_{CMP}$ according to a difference between the inputs $V_{IN1}$ and $V_{IN2}$ and an output buffer circuit (output section) 3 for outputting a voltage $V_{OUT}$ based on the comparison current $I_{CMP}$. The differential input comparison circuit 2 in accordance with the present embodiment includes first and second input circuits (first and second input sections) 4 and 5 wherein input dynamic ranges are mutually different as input circuits for converting respective inputs $V_{IN1}$ and $V_{IN2}$. Additionally, the operational amplifier circuit 1 includes a switching circuit (selection means) 6 for switching between the input circuits 4 and 5 in response to the inverting inputs $V_{IN2}$. Additionally, the input dynamic ranges are respectively in the ranges of the input voltages $V_{IN1}$ and $V_{IN2}$ at which respective circuits are operable.

The first input circuit 4 directly converts the respective inputs $V_{IN1}$ and $V_{IN2}$ into the currents $I_1$ and $I_2$. On the other hand, the second input circuit 5 includes level shifters 7 for generating $V_{SFT1}$ and $V_{SFT2}$ by shifting respective levels of the inputs $V_{IN1}$ and $V_{IN2}$ and converts the level-shifted voltages $V_{SFT1}$ and $V_{SFT2}$ into the currents $I_1$ and $I_2$. Therefore, the second input circuit 5 can be operated at a lower input voltage $V_{IN}$ compared with the first input circuit 4. Furthermore, the switch circuit 6 operates the second input circuit 5 when the inverting input $V_{IN2}$ is too low to operate the first input circuit 4. As a result, the operational amplifier circuit 1 increases an input dynamic range and can be operated in a entire range from the GND level voltage of the power source voltage $V_{CC}$.

Specifically, the differential input compression circuit 2 is composed of the first and second input circuits 4 and 5 and the P-type MOS transistors P1 and P2, and includes a current mirror circuit that becomes an active load of the input circuits 4 and 5 and N-type MOS transistors N3, N4 and N5 that become a constant current source of the differential input comparison circuit 2. Each of the MOS transistors N3 through N5 is arranged such that a bias terminal BN is connected to a gate, and a source is connected to ground. As a result, respective MOS transistors N3 through N5 can absorb a predetermined bias current from respective drains. Additionally, the MOS transistor N4 corresponds to a constant current source described in claims of the present invention, and the MOS transistors N3 and N5 correspond to the shift amount reduction-use current source.

The first input circuit 4 includes input transistors (first and second input transistors) N11 and N12 composed of the N-type MOS transistors. The gate of the input transistor N11 is connected to the non-inverting input terminal IN1, and the gate of the input transistor N12 is connected to the inverting input terminal IN2. Furthermore, respective drains of the input transistors N11 and N12 are connected to respective drains of the MOS transistors P1 and P2. After respective sources of the input transistors N11 and N12 are mutually connected, they are connected to the drain of the MOS transistor N4. As a result, the first input circuit 4 can take in respective currents $I_1$ and $I_2$ according to the inputs $V_{IN1}$ and $V_{IN2}$ from respective drains of the input transistors N11 and N12.

On the other hand, the second input circuit 5 includes input transistors (third and fourth input transistors) N13 and N14 composed of N-type MOS transistor, and the P-type MOS transistors (shift amount control-use transistors) P15 and P16 which constitute the level shifters 7. The MOS transistor P15 is arranged such that the gate is connected to the non-inverting input terminal IN1, and the source is connected to the gate of the input transistor N13. The drain of the MOS transistor P15 is connected to ground. Furthermore, to the gate of the input transistor N13, a drain of the MOS transistor (shift amount increase-use power source) P46 of a switch circuit 6 (to be described later) and a drain of the MOS transistor N3 serving as a constant current source are connected. While a current is being supplied by the switch circuit 6 from the MOS transistor P46, the level shifter 7 on the side of the non-inverting input P46 generates a voltage $V_{SFT1}$ which is higher than the non-inverting input $V_{IN1}$ for the threshold value voltage $V_{thP}$ of the MOS transistor P15 compared with the non-inverting input $V_{IN}$ to be applied to the gate of the MOS transistor N13.

Similarly, the gate of the MOS transistor P16 is connected to the inverting input IN2, and the source of the MOS transistor P16 is connected to the gate of the MOS transistor N14, the drain of the MOS transistor N5, and the drain of the MOS transistor (shifted amount increase-use power source) P45 provided in the switch circuit 6. Additionally, the drain of the MOS transistor P16 is connected to ground. As a result, the level shifter 7 on the inverting input side can apply a higher voltage $V_{SFT2}$ by the threshold value voltage $V_{thP}$ of the MOS transistor P16 compared with the inverting input $V_{IN2}$ while a current is being applied from the switch circuit 6 to the gate of the MOS transistor N14.

In the level shifters 7, even while a current is not being supplied by the switch circuit 6, the MOS transistors N3 and N5 serving as a constant current source take in a predetermined current from the drain. Therefore, during this period, the output voltages $V_{SFT}1$ and $V_{SFT2}$ of the level shifters 7 are held at low level by the drain current.

The respective drains of the input transistors N13 and N14 are respectively connected to the drains of the MOS transistors P1 and P2 as in the input transistors N11 and N12 of the first input circuit 4, and the sources are mutually connected, and then they are connected to the drain of the MOS transistor N4. Therefore, the second input circuit 5 can take in the currents $I_1$ and $I_2$ according to respective gate voltages $V_{SFT1}$ and $V_{SFT2}$ from the respective drains of the input transistors N13 and N14.

The MOS transistors P15 and P16 are manufactured so as to have equivalent respective channel structures to attain the same characteristics of the threshold value voltage $V_{thP}$. Therefore, there is no change in difference between the inputs $V_{IN1}$ and $V_{IN2}$ after the level shift which reflects a difference between the currents $I_1$ and $I_2$.

In the input circuits 4 and 5, as the input transistors N11 through N14 have the same polarity, the respective directions of the currents $I_1$ and $I_2$ are the same. Therefore, the input circuits 4 and 5 can take in the current $I_1$ according to the non-inverting input $V_{IN1}$ and the current $I_2$ according to the non-inverting input $V_{IN2}$ from the current mirror circuit which serves as an active load even when either one of the circuits is operated.

On the other hand, in the current mirror circuit, the respective gates of the MOS transistors P1 and P2 are connected to the drain of the MOS transistor P2 after the gates are mutually connected. Furthermore, the drain of the MOS transistor P1 is connected to the input transistors N11 and N13 on the non-inverting input sides of the input circuits 4 and 5, and the drain of the MOS transistor P2 is connected to the input transistors N12 and N14 on the inverting input side. Additionally, to a junction between the MOS transistor P1 and the input transistors N11 and N13, an output buffer circuit 3 is connected. To respective sources of the MOS transistors P1 and P2, a power source voltage $V_{CC}$ is applied.

As a result, the MOS transistor P1 can output a current in the same amount as a current flowing through the MOS transistor P2, i.e., a current $I_2$ according to the inverting input $V_{IN2}$ to input transistors N11 and N13. On the other hand, the current $I_1$ flowing through the input transistors N11 and N13 are controlled by the non-inverting input $V_{IN1}$. Therefore, the differential input comparison circuit 2 can control a comparison current $I_{CMP}$ to be output to the output buffer circuit 3 according to a difference between the non-inverting input $V_{IN1}$ and the inverting input $V_{IN2}$.

On the other hand, the output buffer circuit 3 includes a P-type MOS transistor (first output transistor) P31 wherein the comparison current $I_{CMP}$ is supplied to the gate and an N-type MOS transistor (second output transistor) N32 for supplying a predetermined current to the MOS transistor P31. The MOS transistors P31 and P32 are arranged such that respective drains are mutually connected, and a conjunction between them is connected to an output terminal OUT. Furthermore, to the source of the MOS transistor P31, a power source voltage $V_{CC}$ is applied, and the source of the MOS transistor N31 is connected to ground. Additionally, to the gate of the MOS transistor N31, a bias terminal BN is connected, and a predetermined bias voltage $V_{BN}$ is applied. Therefore, the MOS transistor N31 can take in a predetermined current. On the other hand, the current flowing through the MOS transistor P31 is controlled based on the comparison current $I_{CMP}$. As a result, the output buffer circuit 3 can controls the output voltage $V_{OUT}$ according to the comparison current $I_{CMP}$.

Furthermore, the switch circuit 6 in accordance with the present embodiment includes a detecting section 6a for detecting whether or not the common input voltage $V_{IN}$ falls in an inoperable region of the first input circuit 4 and a constant current source 6b for operating the second input circuit 5 by supplying a predetermined current to the second input circuit 5 when the common input voltage $V_{IN}$ falls in the inoperable region.

The detecting section 6a includes a detection-use transistor N41 for conducting/cutting off based on the inverting input $V_{IN2}$, a P-type MOS transistor P42 for supplying a predetermined current to the detection-use transistor N41 and a P-type MOS transistor P43 for outputting a detection signal $V_{SEL}$ to the constant current source 6b according to the potential of the junction between the transistors P42 and N41. The detection-use transistor N41 is the NMOS transistor having the same arrangement as the input transistor N12 formed in the first input circuit 4 of the differential input comparison circuit 2, and the transistors N41 and N12 are arranged such that respective gates and sources are mutually connected. Therefore, the detection-use transistor N41 can accurately detect if the inverting input $V_{IN2}$ is in an operable region of the input transistor N12. Additionally, a power source voltage $V_{CC}$ is applied to the source of the MOS transistor P42, and the gate is connected to the bias terminal BP. Therefore, from the drain of the MOS transistor P42, a predetermined current can be supplied to the drain of the detection-use transistor N41. Furthermore, a junction between the both transistors P42 and N41 is connected to the gate of the MOS transistor P43. To the MOS transistor P43, a power source voltage $V_{CC}$ is applied to the source, and the drain of the MOS transistor P43 is connected to the constant current source 6b.

When the inverting input $V_{IN2}$ falls in an operable region of the input transistor N12, the detection-use transistor N41 conducts. Therefore, the gate potential of the MOS transistor P43 drops and the MOS transistor P43 conducts. On the other hand, when the inverting input $V_{IN2}$ falls in an inoperable region, the detection-use transistor N41 does not conduct, and the MOS transistor P43 cuts off. As a result, the detecting section 6a informs if the input transistor N12 is in an operation region to the constant current source 6b as the drain potential $V_{SEL}$ of the MOS transistor P43.

On the other hand, the constant current source 6b includes a current mirror circuit composed of P-type MOS transistors P44 through P46 wherein gates are mutually connected and a N-type MOS transistor N47 as a constant current source of the current mirror circuit. The respective drains of the MOS transistors P45 and P46 are respectively connected to the gates of the input transistors N13 and N14 in the second input circuit 5 of the differential input comparison circuit 2.

The drain of the MOS transistor P44 is connected to its gate, and further to the drain of the MOS transistor N47. Additionally, to respective sources of the MOS transistors P44 through P46, a power source voltage $V_{CC}$ is applied. The source of the MOS transistor N47 is connected to ground, and to the gate, a bias voltage $V_{BN}$ is applied from the bias terminal BN.

To a junction between the MOS transistors P44 and N47, a drain of the MOS transistor P43 of the detecting section 6a is connected, and a detection signal $V_{SEL}$ is applied from the detecting section 6a. As a result, the constant current source 6b can select if a current is applied to the second input circuit 5 in response to an instruction from the detecting section 6a.

An operation in each section of the operational amplifier circuit 1 having the described arrangement will be explained in reference to input/output voltage characteristics of each section shown in FIG. 3 and the flowcharts shown in FIGS. 4 and 5.

Figure 3:
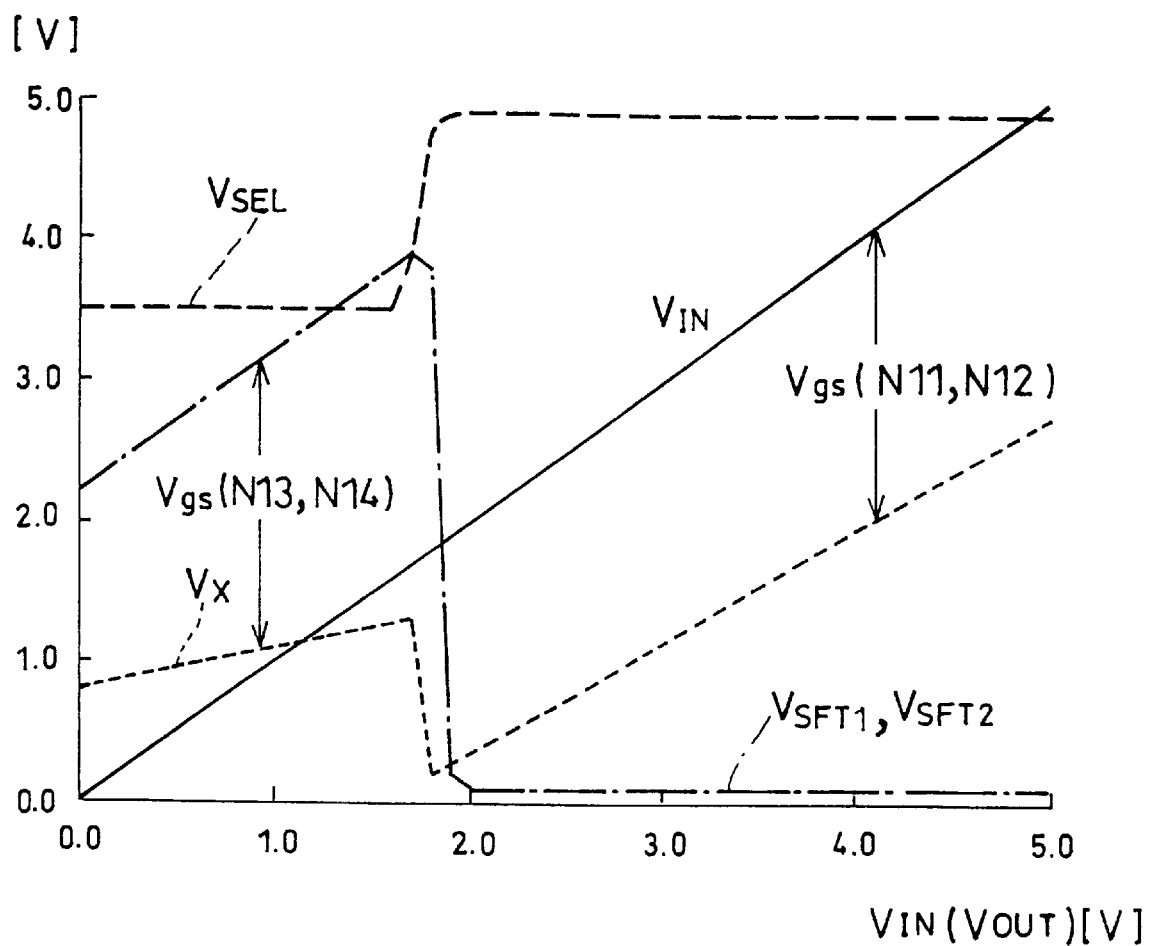
FIG. 3 is a graph showing a relationship between an input/output voltage and a potential of each member in the operational amplifier circuit.

Namely, as shown in FIG. 3, when the common input voltage $V_{IN}$ with the non-inverting input $V_{IN1}$ and the inverting input $V_{IN2}$ are sufficiently high, for example, 2 V or above, the common input voltage $V_{IN}$ satisfies the condition of $V_{IN} \geq GND+V_{thN}$. Therefore, in the differential input comparison circuit 2, the MOS transistor N4 can supply a predetermined current. As a result, a sufficient gate-source voltage $V_{gs}$ (N11 and N12) of the input transistors N11 and N12 can be ensured, and the input transistors N11 and N12 conduct. Therefore, the first input circuit 4 becomes operable, and inputs $V_{IN1}$ and $V_{IN2}$ can be converted into currents $I_1$ and $I_2$ without problems.

Figure 4:
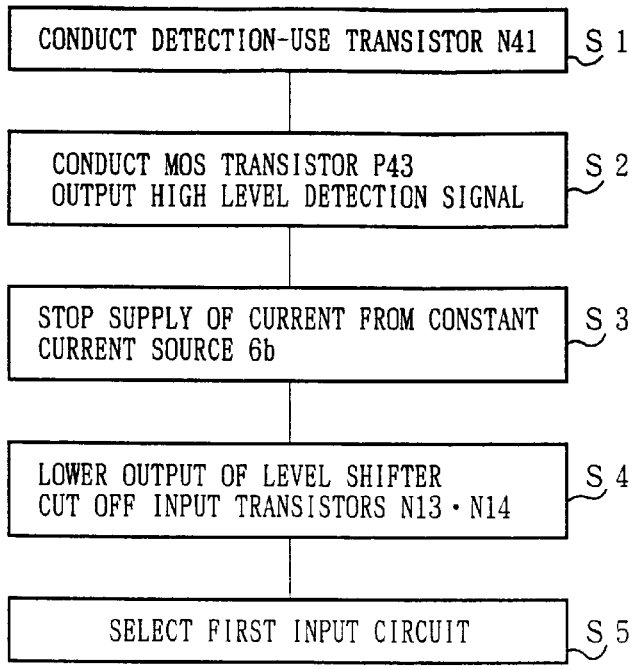
FIG. 4 is a flowchart showing an operation in the operational amplifier circuit in response to a high input.

In this state, as shown in FIG. 4, in step 1 (hereinafter referred to as S1), a detection-use transistor N41 provided in the detecting section 6a of the switch circuit 6 is set ON. As a result, a predetermined current supplied from the MOS transistor P42 is flown through the detection use transistor N41, and a potential of a junction between the transistors P42 and N41, i.e., a gate voltage of the MOS transistor P43 is set low. Therefore, the MOS transistor P43 is set in an ON state, and the detecting section 6a applies a detection signal $V_{SEL}$ of high level to the constant current source 6b (S2) as shown in FIG. 3.

In the constant current source 6b shown in FIG. 1, the detection signal $V_{SEL}$ is supplied to the respective gates of the MOS transistors P44 through P46 which constitute the current mirror circuit. Therefore, when the detection signal $V_{SEL}$ becomes high level, the current mirror circuit is set in an off state, and the constant current source 6b does not supply current to the second input circuit 5 of the differential input comparison circuit 2 (S3).

Furthermore, in the second input circuit 5, as current is not supplied from the constant current source 6b, the level shifters 7 are not operated. In this state, the respective gate voltages $V_{SFT1}$·$V_{SFT2}$ of the input transistors N13 and N14 are lowered due to drain currents of the MOS transistors N3 and N5 which serve as a constant current source and are held at a low value of around 0 V as shown in FIG. 3. Therefore, the respective input transistors N13 and N14 are set off, and do not absorb currents from respective drains. As a result, the second input circuit 5 stops operating without adversely affecting an operation in the first input circuit 4 (S4). 27.

In contrast, in the first input circuit 4, as the common input voltage $V_{IN}$ is sufficiently high, a gate-source voltage $V_{gs}$ of each of the input transistors N11 and N12 is larger than a threshold voltage $V_{thN}$, and respective input transistors N11 and N12 conduct. Therefore, the input transistor N11 controls a drain current $I_1$ according to the non-inverting input $V_{IN1}$, and the input transistor N12 takes in the current $I_2$ according to the inverting input $V_{IN2}$. As a result, the first input circuit 4 effectively operates as the input circuit of the operational amplifier circuit 1 (S5).

The current $I_2$ is applied to one MOS transistor P2 which constitutes a current mirror circuit. Therefore, the other transistor P1 outputs a current in the same level as the current $I_2$ to the input transistor N11. On the other hand, a current $I_1$ flowing through the input transistor N11 is controlled by a non-inverting input $V_{IN1}$. As a result, a comparison current $I_{CMP}$ flowing in the output buffer circuit 3 is controlled according to a difference between the inputs $V_{IN1}$ and $V_{IN2}$.

On the other hand, the output buffer circuit 3 increases or decreases the output voltage $V_{OUT}$ according to the comparison current $I_{CMP}$. For example, when the non-inverting input $V_{IN1}$ is higher than the inverting input $V_{IN2}$, the current $I_1$ flowing in the input transistor N11 becomes larger than the current $I_2$ flowing through the input transistor N12, and exceeds the current supplied from the MOS transistor P1. As a result, a comparison current $I_{CMP}$ reduces, and a gate potential of the MOS transistor P31 provided in the output buffer circuit 3 is lowered. As a result, a current in the output buffer circuit 3 increases which causes the output voltage $V_{OUT}$ to be increased.

On the other hand, when the non-inverting input $V_{IN1}$ is lower than the inverting input $V_{IN2}$, as $I_1$ becomes lower than $I_1$, a comparison current $I_{CMP}$ increases. As a result, a gate potential of the MOS transistor P31 increases, and the MOS transistor P31 reduces a current to be output to the MOS transistor N32. In this case also, the current flowing through the MOS transistor N32 is held at a predetermined value by the bias voltage $V_{BM}$. Therefore, a potential at a junction of the MOS transistors P31 and P32, i.e., an output voltage $V_{OUT}$ is lowered.

As a result, the operational amplifier circuit 1 outputs a voltage $V_{OUT}$ according to a difference between the inputs $V_{IN1}$ and $V_{IN2}$. In this embodiment, the output terminal OUT is connected to the inverting input terminal IN2 to form a voltage follower circuit. Therefore, the output voltage $V_{OUT}$ of the operational amplifier circuit 1 is adjusted to be the same as the non-inverting input $V_{IN1}$.

As shown in FIG. 3, the respective source voltages of the input transistors N11 and N12, i.e., the drain voltage $V_X$ of the MOS transistor N4 serving as a constant current source is reduced as the common input voltage $V_{IN}$ is lowered. Therefore, when the common input voltage $V_{IN}$ is reduced too much, it becomes difficult to operate the MOS transistor N4, and the current to be supplied is reduced. When the common input voltage $V_{IN}$ is still reduced, the gate-source voltage $V_{gs}$ (N11, N12) of the input transistors N11 and N12 becomes not more than the threshold voltage $V_{thN}$. As a result, the input transistors N11 and N12 cut off, and the first input circuit 4 cannot be operated properly.

Figure 5:
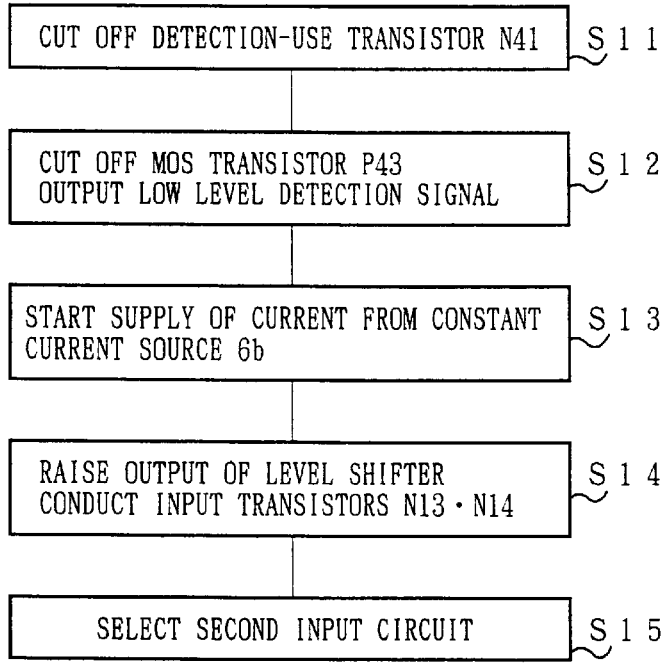
FIG. 5 is a flowchart showing an operation in the operational amplifier circuit in response to a low input.

However, in the operational amplifier circuit 1 in accordance with the present embodiment, when the common input voltage $V_{IN}$ is reduced so as to satisfy the condition of $V_{IN}<GND+V_{thN}$, for example, to not more than 1.8 V, the detection-use transistor N41 of the switch circuit 6 cuts off (S11 shown in FIG. 5). As a result, in contrast to the case wherein the common input voltage $V_{IN}$ is high, the MOS transistor P43 cuts off, and as shown in FIG. 3, the detecting section 6a outputs a detection signal $V_{SEL}$ of the low level (S12). Furthermore, in the constant current source 6b, the current mirror circuit is operated, and the MOS transistors P45 and P46 start supplying a predetermined current to the second input circuit 5 of the differential input comparison circuit 2 (S13).

In the second input circuit 5, by a constant current to be supplied from the MOS transistor P45, a gate potential $V_{SFT1}$ of the input transistor N13 increases, and the input transistor N13 is set in the ON state. Then, the gate potential $V_{SFT1}$ increases and when a difference between the non-inverting inputs $V_{IN1}$ and $V_{SFT1}$ exceeds a threshold value voltage $V_{thP}$ of the MOS transistor P15, the MOS transistor P15 conducts and lowers the gate potential $V_{SFT1}$. Therefore, as shown in FIG. 3, the gate potential $V_{SFT1}$ is held at higher value than the non-inverting input $V_{IN1}$ by $V_{thP}$. In the similar manner, the gate potential $V_{SFT2}$ of the input transistor N14 is held at a higher value than the inverting input $V_{IN2}$ by $V_{thP}$ (S14).

In this state, as the respective gate voltages $V_{SFT1}$ and $V_{SFT2}$ of the input transistors N13 and N14 increase, the source potential $V_X$ increases. In the first and second input circuits 4 and 5 in accordance with the present embodiment, a power source is used in common, and the respective sources of the input transistors N11 through N14 are connected to the drain of the transistor N4. Therefore, in accordance with operations of the level shifters 7, as the source potentials $V_X$ of the input transistors N11 through N14 increase, in the input transistors N11 and N12 of the first input circuit 4, the gate-source voltage $V_{gs}$ is reduced to be $V_{gs}<V_{thN}$. As a result, the first input circuit 4 surely stops an operation, and the input circuit of the operational amplifier circuit 1 is switched to the second input circuit 5 from the first input circuit 4 (S15).

In the second input circuit 5, the respective gate voltages $V_{SFT1}\cdot V_{SFT2}$ of each gate of the input transistors N13 and N14 increase by the threshold value voltage $V_{thP}$ of the MOS transistors P15 and P16, currents $I_1$ and $I_2$ flowing through respective input transistors N13 and N14 are controlled based on the gate voltages $V_{SFT1}$ and $V_{SFT2}$. The respective shapes and positions of the transistors P15 and P16 are selected so as to have equivalent characteristics such as a threshold value voltage $V_{thp}$, etc. Therefore, a difference between the gate voltages $V_{SFT1}$ and $V_{SFT2}$ is equivalent to a difference between the inputs $V_{IN1}$ and $V_{IN2}$, and a difference between the currents $I_1$ and $I_2$ varies according to a difference between the inputs $V_{IN1}$ and $V_{IN2}$.

As in the case where the first input circuit 4 is operated, the differential input comparison circuit 2 generates a comparison current $I_{CMP}$ according to a difference between the currents $I_1$ and $I_2$, and the output buffer circuit 3 outputs a voltage $V_{OUT}$ according to the comparison current $I_{CMP}$. Therefore, the operational amplifier circuit 1 operates as if the inputs $V_{IN1}$ and $V_{IN2}$ increase by $V_{thP}$ in a region where the common input voltage $V_{IN}$ is too low to operate the first input circuit 4. As a result, the input dynamic range of the operational amplifier circuit 1 is increased by the threshold voltage $V_{thP}$ to be from the GND potential to the power source voltage $V_{CC}$ compared with the conventional arrangement. Additionally, in the output buffer circuit 3 in accordance with the present embodiment, even when either one of the input circuits 4 and 5 is selected, the current flowing through the MOS transistor N32 is held at a predetermined value by the bias voltage $V_{BN}$. As a result, an output dynamic range of the output buffer circuit 3 is in a range of from the ground level GND to the power source voltage $V_{CC}$. As a result, as in the conventional arrangement, compared with the case where the output buffer circuit carries out a push-pull operation, an output dynamic range of the operational amplifier circuit 1 can be increased.

Therefore, even in the case of forming the voltage follower circuit by connecting the output terminal OUT to the inverting input terminal IN2, the input dynamic range of the operational amplifier circuit 1 is not restricted. As a result, in the voltage follower circuit outputs an impedance of the non-inverting input $V_{IN1}$ to an entire range from the ground level GND to the power source voltage $V_{CC}$.

Figure 6:
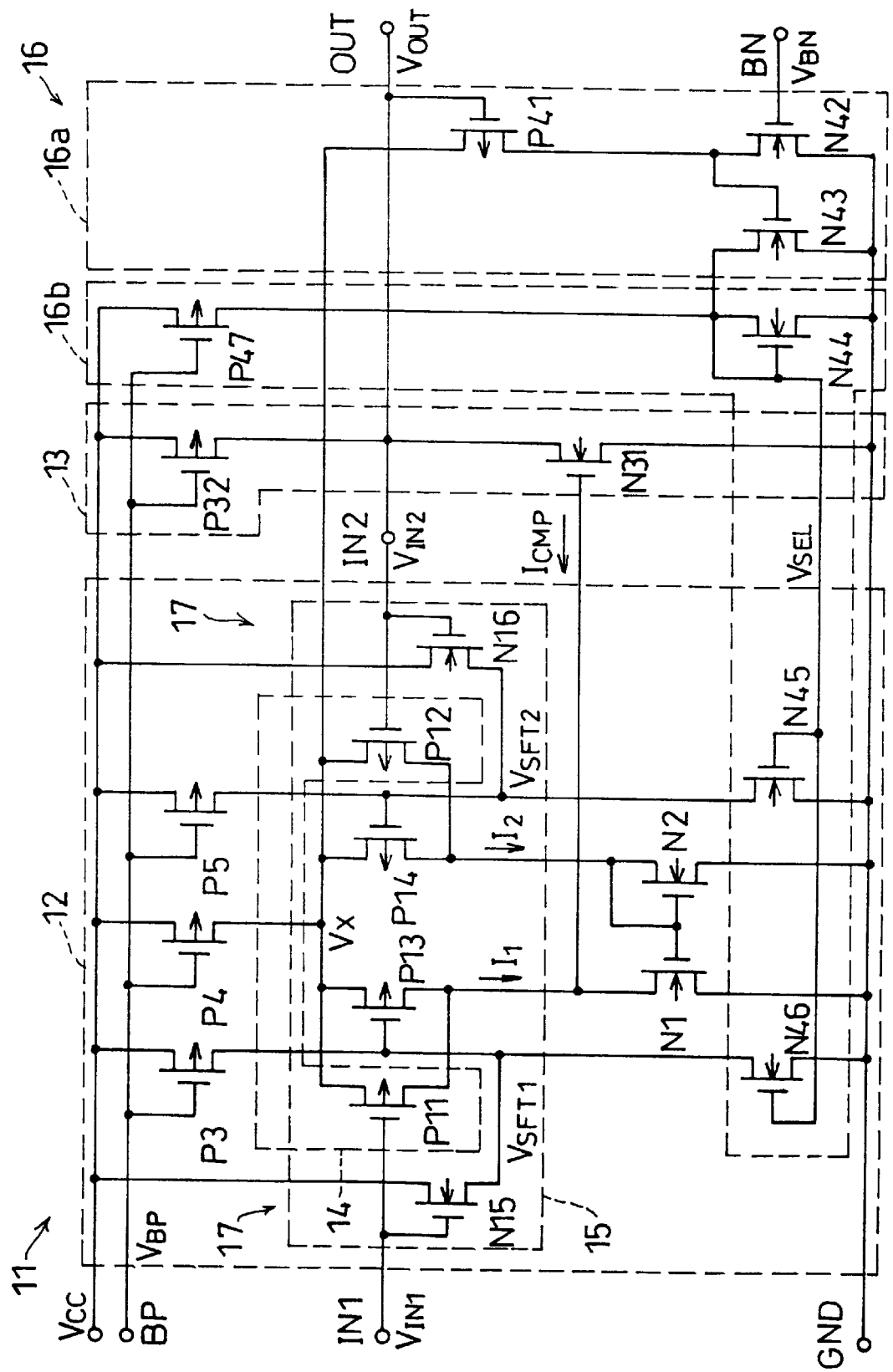
FIG. 6 is a circuit diagram showing essential parts of the operational amplifier circuit in detail in accordance with one modified example of the operational amplifier circuit.

In the above explanation, explanations have been given through the case where the input transistors N11 through N14 of the first and second input circuits 4 and 5 are formed by the N-type MOS transistor, and needless to mention, the same effects can be obtained even in the case of adopting the PMOS transistor. As shown in FIG. 6, in the case of adopting the P-type operational amplifier circuit 11 as the input transistor, compared with the operational amplifier circuit 1 shown in FIG. 1, the P/N polarities of all the transistors are reversed, and accordingly respective positions to which the power source voltage $V_{CC}$ is applied are changed. Additionally, the differential input comparison circuit 2 through the level shifter 7 shown in FIG. 1 is replaced by the differential input comparison circuits 12 through the level shifter 17 having a reverse polarity. Other arrangements than the described arrangement are the same as the operational amplifier circuit 1. Therefore, members having the same functions as aforementioned members will be designated by the same numerals only by changing the character from P to N, for example, like the NMOS transistor N1 which functions similar to the PMOS transistor P1, legends having the same numbers and different characters are designated, and the descriptions thereof shall be omitted here.

[Second Embodiment]

In the described first embodiment, explanations will be given through the case of adopting one non-inverting input terminal IN1. In contrast, in the present embodiment, explanations will be given through the case of adopting an operational amplifier circuit which permits a plurality of inputs in reference to FIG. 7 through FIG. 9.

Figure 7:
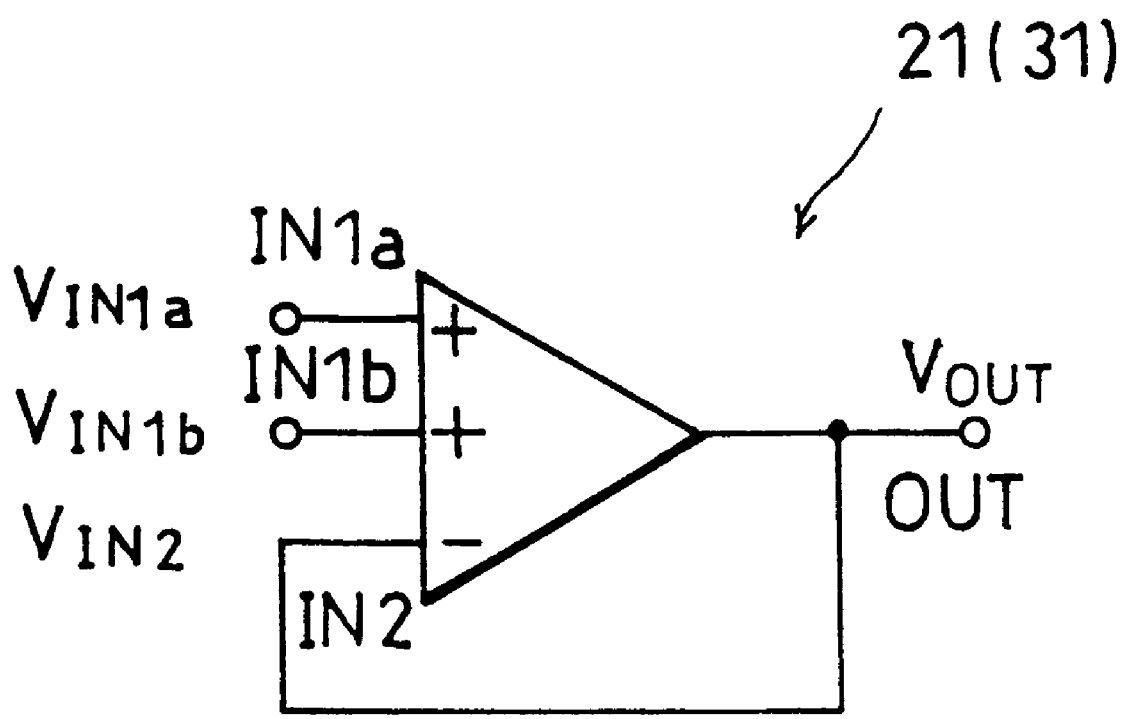
FIG. 7 is a circuit diagram of a voltage follower circuit formed using an operational amplifier circuit of a plurality of inputs in accordance with the second embodiment of the present invention.

As shown in FIG. 7, an operational amplifier circuit 21 in accordance with the present embodiment includes first and second non-inverting input terminals IN1a and IN1b, and one of first and second non-inverting input $V_{IN1a}$ and $V_{IN1b}$ can be selected as a non-inverting input $V_{IN1}$ by inputs of the control terminals CTRa and CTRb.

Figure 8:
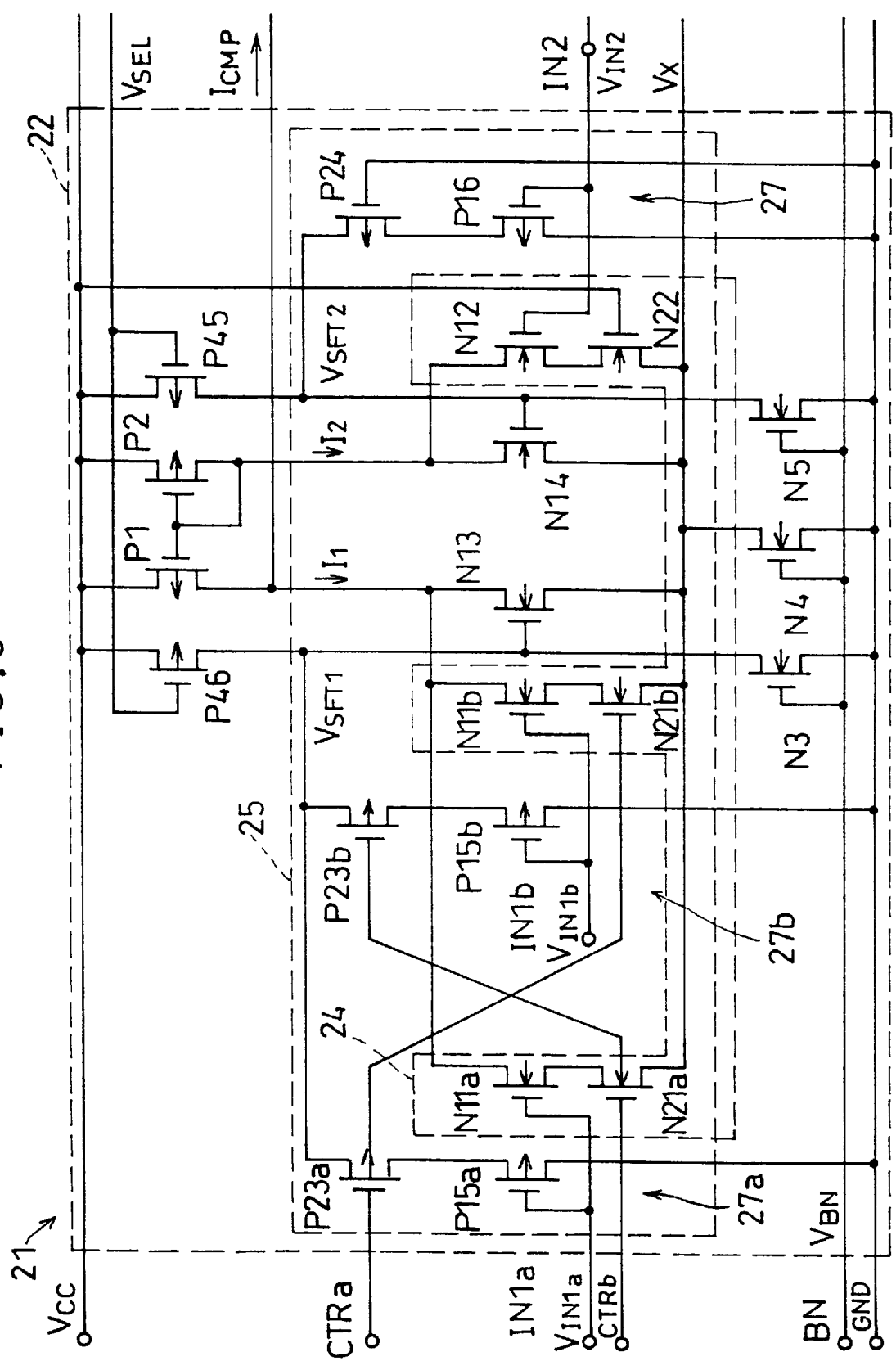
FIG. 8 is a circuit diagram showing a differential input comparison circuit of the operational amplifier circuit in detail.

The operational amplifier circuit 21 has almost the same structure as the operational amplifier circuit 1 shown in FIG. 1 except that a differential input comparison circuit 22 corresponding to a plurality of inputs is provided as shown in FIG. 8 in replace of the differential input comparison circuit. Here, members having the same functions as those of the aforementioned embodiment will be designated by the same reference numerals, and thus the descriptions thereof shall be omitted here.

In the differential input comparison circuit 22, the first input circuit 24 includes two input transistors N11a and N11b on the non-inverting input side. The gate of the input transistor N11a is connected to the first non-inverting input terminal IN1a, and the gate of the input transistor 11b is connected to the second non-inverting input IN1b. The input transistors N11a and N11b are N-type MOS transistors like the input transistor N11 shown in FIG. 1, and the respective drains of the input transistors N11a and N11b are connected to the drain of the MOS transistor P1 which serves as an active load.

Furthermore, between respective sources of the input transistors N11a and N11b and a drain of the MOS transistor N4 which serves as a constant current source, switching-use transistors (input switches) N21a and N21b which are N-type MOS transistors are respectively provided. The gate of the switching-use transistor N21a is connected to the control terminal CTRb, and according to a voltage level of the control terminal CTRb, the switching-use transistor N21a can cut off or conduct. Similarly, the gate of the switching-use transistor N21b is connected to the control terminal CTRa.

Similarly, on the inverting input side of the first input circuit 24, an N-type MOS transistor N22 is added between the source of the input transistor N12 and the drain of the MOS transistor N4 to be balanced with the non-input terminal side. To the gate of the MOS transistor N22, a power source voltage $V_{CC}$ is applied, and during an operation of the first input circuit 24, the MOS transistor N22 is always kept in the ON state.

Since the respective switching-use transistors N21a and N21b can cut off the current flowing through the corresponding input transistors N11a and N11b, the first input circuit 24 is permitted to select one of the non-inverting inputs $V_{IN1a}$ and $N_{IN1b}$ according to an input of the control terminal CTRa or CTRb.

On the other hand, the second input circuit 25 includes two level shifters 27a and 27b corresponding to respective non-inverting input terminals IN1a and IN1b on the non-inverting input side. Specifically, as in the MOS transistor P15 shown in FIG. 1, the P-type MOS transistors P15a and P15b are provided such that respective gates are connected to the non-inverting input terminals IN1a and IN1b respectively, and between the sources of respective MOS transistors P15a and P15b, and the gate of the input transistor N13, P-type MOS transistors are provided as switching-use transistors (input switching devices) P23a and P23b. The gates of respective switching-use transistors P23a and P23b are connected to the control terminals CTRa and CTRb respectively, and according to the voltage levels of respective control terminals CTRa and CTRb, between the gate of the input transistor N13 and the MOS transistor P15a and between the gate of the input transistor N13 and the MOS transistor P15b can be respectively conducted and cut off.

On the inverting input side, in order to have a balance with the non-inverting input side, between the gate of the input transistor N14 and the source of the MOS transistor P16, the P-type MOS transistor P24 is provided. The MOS transistor P24 is arranged such that the gate is connected to ground, and the MOS transistor P24 always conduct during the operation of the second input circuit 25.

In the described arrangement, in the case where the control terminal CTRa is in the high level, and the control terminal CTRb is in the low level, the switching-use transistors N21a and P23a cut off, and the switching-use transistors N21b and P23b conduct. As a result, the operational amplifier circuit 21 selects the second non-inverting input terminal IN1b from the non-inverting input terminals IN1a and IN1b.

Specifically, in the case where the switch circuit 6 selects the second input circuit 25, the level shifter 27b outputs $V_{IN1b}+V_{thP}$ as a shift voltage $V_{SFT1}$. On the other hand, as the MOS transistor P24 always conducts, the level shifter 27 outputs $V_{IN2}+V_{thP}$ as the shift voltage $V_{SFT2}$. Additionally, as the switching-use transistor P23a cuts off, the level shifter 27a cuts off from the gate of the input transistor N13. As a result, the currents $I_1$ and $I_2$ flowing in the input transistor N13 and N14 are controlled based on the non-inverting inputs $V_{IN1b}$ and the inverting input $V_{IN2}$ and the operational amplifier circuit 21 outputs a voltage $V_{OUT}$ according to a difference between the inputs $V_{IN1b}$ and $V_{IN2}$.

Additionally, when the switch circuit 6 selects the first input circuit 24, a current is not supplied to each of the level shifters 27a, 27b and 27. Therefore, the second input circuit 25 stops operating even when either of the switching-use transistors P23a and P23b conducts. On the other hand, in the first input circuit 24, the switching-use transistor N21b conducts. Therefore, the input transistor N11b controls the current $I_1$ according to the non-inverting input $V_{IN1b}$. Additionally, as the switching-use transistor N21a cuts off, the input transistor N11a is separated from the MOS transistor P1 that is an active load of the first input circuit 24. Therefore, irrespectively of a change in the non-inverting input $V_{IN1a}$, the current $I_1$ does not vary. On the other hand, on the inverting input side, the MOS transistor N22 always conduct. Therefore, the input transistor N12 controls the current $I_2$ according to the inverting input $V_{IN2}$. As a result, the first input circuit 24 controls the currents $I_1$ and $I_2$ based on the non-inverting input $V_{IN1b}$ and the inverting input $V_{IN2}$, and the operational amplifier circuit 21 outputs a voltage $V_{OUT}$ according to a difference between the inputs $V_{IN1b}$ and $V_{IN2}$.

In contrast, in the case where the control terminal CTRa is in the low level, and the control terminal CTRb is in the high level, the switching-use transistors N21b and P23b cut off, and the switching-use transistors N21a and P23a conduct. Therefore, in contrast to the described explanation, the operational amplifier circuit 21 selects the first non-inverting input terminal IN1a between the non-inverting input terminals IN1a and IN1b, and outputs a voltage $V_{OUT}$ according to a difference between the non-inverting inputs $V_{IN1a}$ and the inverting input $V_{IN2}$.

By controlling the control terminals CTRa and CTRb so as to alternately ON/OFF, the operational amplifier circuit 21 alternately selects an input of a plurality of the non-inverting input terminals IN1a and In1b. Therefore, a negative feed back circuit constituted by connecting the inverting input terminal IN2 and the output terminal OUT alternately performs an impedance conversion of a plurality of inputs, and outputs the inputs thus converted.

The respective shapes, arrangements and impurity densities of the input transistors N11a, N11b, N12, N13 and N14 are selected so as to have mutually the same characteristics. Similarly, the MOS transistors P15a, P15b and P16 of the level shifters 27a, 27b and 27 are selected so as to have mutually the same characteristics. Therefore, irrespectively of which one of the non-inverting inputs $V_{IN1a}$ and $V_{IN1b}$ is selected, the differential input comparison circuit 22 can generate a comparison current $I_{CMP}$ based on the selected non-inverting input $V_{IN1}$ and the inverting input $V_{IN}$ with accuracy.

To be specific, respective amounts of shifts of the level shifters 27a and 27b on the non-inverting input side slightly increase from the respective threshold voltage $V_{thP}$ of the MOS transistors P15a and P15b by a drop in voltage of the switching-use transistors P23a and P23b. However, as the MOS transistor P24 having the same arrangement as the switching-use transistors P23a and 23b is provided in the level shifter 27 on the inverting input side, the level shifters 27a, 27b and 27 respectively have the same amount of shift. Similarly, in the first input circuit 24, the MOS transistor N22 having the same arrangement as those of the switching-use transistors N21a and N21b is connected.

With an appropriate selection of the shapes, etc., the transistors N21a, N21b and N22 are formed so as to have the same characteristics, and the transistors P23a, P23b and P24 are also formed so as to have the same characteristics. As a result, an error due to the switching-use transistor in the differential input comparison circuit 22 can be suppressed.

Figure 9:
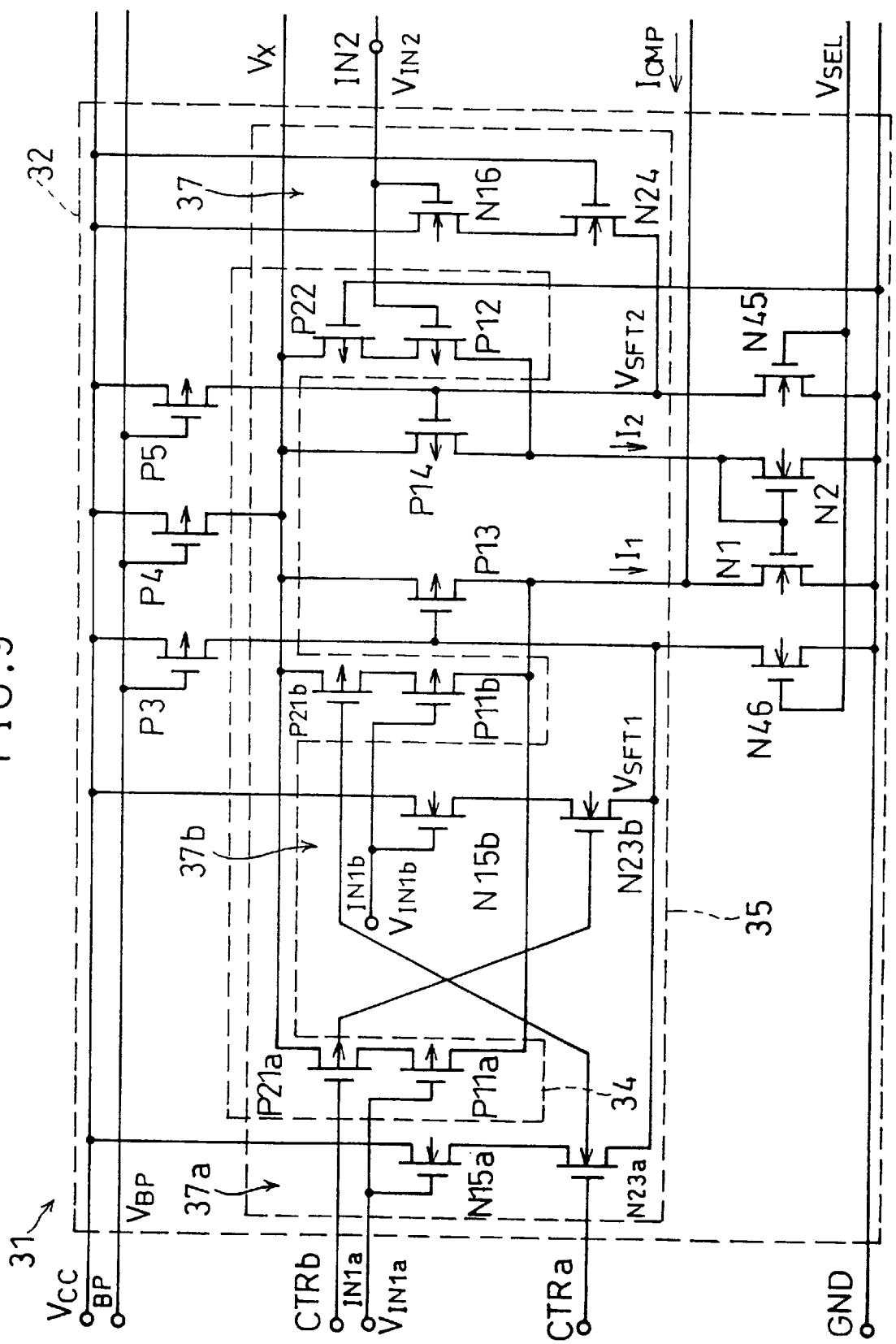
FIG. 9 which shows one modified example of the operational amplifier circuit is a circuit diagram showing a differential input comparison circuit in detail.

In reference to FIG. 8, explanations have been give through the case of N-type input transistors N11a through N14 are adopted; however, the same effect can be obtained in the case adopting the P-type transistors. In the described arrangement, the operational amplifier circuit 31 has the same arrangement as the operational amplifier circuit 11 shown in FIG. 6; however, in the present embodiment, the differential input comparison circuit 32 shown in FIG. 9 is provided in replace of the differential input comparison circuit 12. The differential input comparison circuit 32 is arranged such that respective PN polarities of all the transistor are reversed from those of the differential input comparison circuit 22, and other than the above, the differential input comparison circuit 32 has the same arrangement including the circuit block, etc., as the differential input comparison circuit 22. Therefore, the differential input comparison circuit 32 operates while only the polarities of the operation power supply are reversed. Therefore, in FIG. 9, the PMOS transistors which have the same functions as those of the differential input comparison circuit 22 will be designated by the same reference numerals, in which only P and N inverse such as the POMS transistor P11a corresponding to the input transistor N11a shown in FIG. 8, and thus the descriptions thereof shall be omitted here.

[Third Embodiment]

Figure 10:
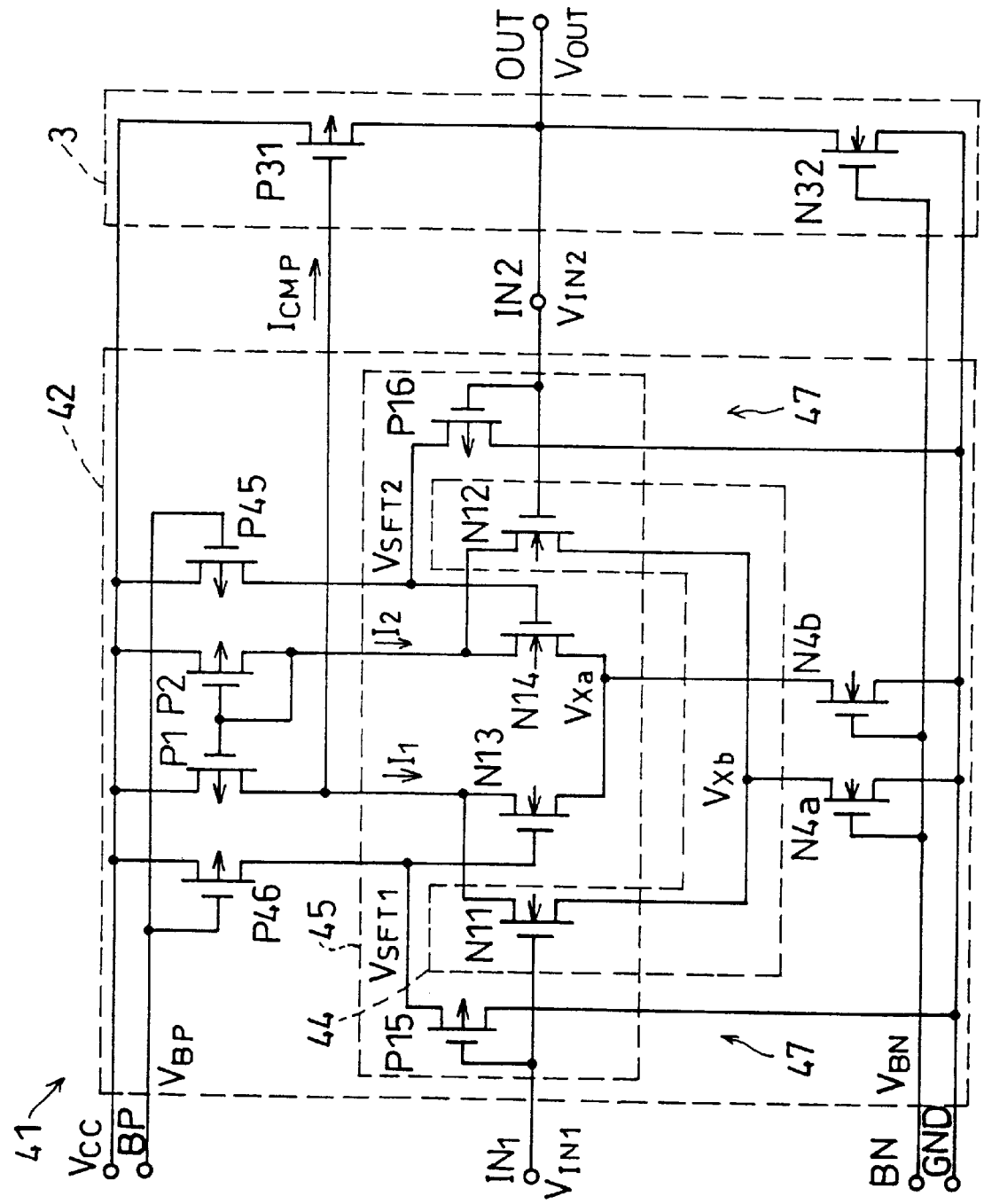
FIG. 10 is a circuit diagram showing essential parts of the operation amplifier circuit in detail in accordance with the third embodiment of the present invention.

According to respective operational amplifier circuits 1 and 21 in accordance with the first and second embodiments, the switch circuit 6 switches such that either one of the first and second input circuits 4 and 5 (24 and 25) operates, and the other circuit stops operating. In the present embodiment, as shown in FIG. 10, explanations will be given on the operational amplifier circuit 41 from which the switch circuit 6 is omitted. Additionally, FIG. 10 shows an arrangement where the N-type input transistor and one non-inverting input terminal IN1 are adopted.

Compared with the arrangement of the operational amplifier circuit 1 shown in FIG. 1, the operational amplifier circuit 41 in accordance with the present embodiment differs in that respective constant current sources of the input circuits 44 and 45 are separately provided, and the switch circuit 6 is omitted.

Specifically, the differential input comparison circuit 42 in accordance with the present embodiment includes N-type MOS transistors (first and second constant current sources) N4a and N4b which serve as the constant current source of the first and second input circuits 44 and 45. As in the MOS transistor N4 shown in FIG. 1, to the MOS transistors N4a and N4b, a predetermined bias voltage $V_{BN}$ is applied to the gate, and the source is connected to ground. Furthermore, in the present embodiment, between the input transistors N11 and N12 of the first input circuit 44 and the input transistors N13 and N24 of the second input circuit 45, respective sources are separately provided. Additionally, the drain of the MOS transistor N4a is connected to the respective sources of the input transistors N11 and N12, and the drain of the MOS transistor N4b is connected to respective sources of the transistors N13 and N14. As a result, respective MOS transistors N4a and N4b independently supply a predetermined bias current to the input circuits 44 and 45.

In the operational amplifier circuit 41 in accordance with the present embodiment, the switch circuit 6 is omitted, and within a range of an input dynamic range, the second input circuit 45 controls currents $I_1$ and $I_2$ based on the voltages $V_{SFT1}$ and $V_{SFT2}$ after being level shifted. Specifically, as in the arrangement shown in FIG. 1, in the second input circuit 45, respective MOS transistors P15 and P16 are provided between respective input terminals IN1 and IN2 and the gates of the input transistors N13 and N14. Additionally, respective gates of the input transistors N13 and N14 are connected to respective drains of the MOS transistors P46 and P45 as in the arrangement shown in FIG. 1. However, the respective gates of the MOS transistors P45 and P46 are connected to the bias terminal BP, and a predetermined bias voltage $V_{BP}$ is applied thereto.

In the present embodiment, as the second input circuit 45 always operates, as shown in FIG. 1, the MOS transistors N3 and N5 for reducing the respective gate potentials of the input transistors N13 and N14 while the second input circuit 4 stops operating can be omitted. Therefore, in the present embodiment, different from FIG. 1, the MOS transistors N3 and N5 are omitted from the differential input comparison circuit 42. Therefore, in the present embodiment, the level shifters 47 are formed by the MOS transistors P15 (P16) and P46 (P45).

To the respective gates of the input transistors N13 and N14, a predetermined current is always flown, and the gate voltages $V_{SFT1}$ and $V_{SFT2}$ increase. On the other hand, the MOS transistors P15 and P16 whose sources are connected to respective gates of the input transistors N13 and N14 lower the respective gate voltages $V_{SFT1}$ and $V_{SFT2}$ when respective differences between the gate voltages $V_{SFT1}$ and $V_{SFT2}$ and the input voltages $V_{IN1}$ and $V_{IN2}$ exceed a threshold value voltage $V_{thP}$. Therefore, in the second input circuit 45, the level shifters 47 generate the voltages $V_{SFT1}$ and $V_{SFT2}$ which are higher than the inputs $V_{IN1}$ and $V_{IN2}$ by a threshold value voltage $V_{thP}$ of respective MOS shift registers P15 and P16 to be applied to the input transistors N13 and N14.

In the described arrangement, while both of the input circuits 44 and 45 are operating, a current $I_2$, i.e., that is a sum of currents flowing in the input transistors N12 and N14, flows. The current $I_2$ flows towards the non-inverting input side through a current mirror circuit composed of the MOS transistors P1 and P2. On the other hand, from the drains of the input transistors N11 and N13 on the non-inverting input side, the current $I_1$, i.e., a sum of the currents flowing therethrough is absorbed, and a comparison current $I_{CMP}$ according to a difference between the currents $I_1$ and $I_2$ flows towards the output buffer circuit 3.

The current $I_1$ is controlled based on the inputs $V_{IN1}$ and $V_{SHT1}$, while the current $I_2$ is controlled by the inputs $V_{IN2}$ and $V_{SFT2}$. As the respective amounts of shifts of the level shifters 47 are the same, the comparison current $I_{CMP}$ becomes in proportion to a difference between the inputs $V_{IN1}$ and $V_{IN2}$. Therefore, the operational amplifier circuit 41 can output a voltage $V_{OUT}$ according to a difference between the inputs $V_{IN1}$ and $V_{IN2}$.

Additionally, when the common input voltage $V_{IN}$ is lowered below the threshold voltage $V_{thN}$, the respective threshold voltages $V_{thN}$ of the input transistors N11 and N12 cannot be ensured, and the first input circuit 44 stops operating.

The respective input transistors N13 and N14 of the second input circuit 45 can ensure the threshold voltage $V_{thN}$ as the voltages $V_{SFT1}$ and $V_{SFT2}$ obtained after level shifting respective inputs $V_{IN1}$ and $V_{IN2}$ are applied to the respective gates. As a result, the second input circuit 45 can convert the inputs $V_{SFT1}$ and $V_{SFT2}$ into the currents $I_1$ and $I_2$ without problems. Therefore, the operational amplifier circuit 41 compares the inputs $V_{IN1}$ and $V_{IN2}$ to the lower limit of the input dynamic range of the second input circuit 45 to generate the output voltage $V_{OUT}$. In the case where the input circuits 44 and 45 always operate within the respective input dynamic ranges, as shown in FIG. 1, if the current source of the input circuits is used in common, the following problem occurs. Namely, when the common input voltage $V_{IN}$ becomes high and exceeds a predetermined level, for example, 4.8 V, the voltages $V_{SFT1}$ and $V_{SFT2}$ after level-shifted may exceed the power source voltage $V_{CC}$. As described, when a difference between the power source voltage $V_{CC}$ and the common input voltage $V_{IN}$ is smaller than an amount of shift of the level shifters 47, the level shifters 47 apply output voltages $V_{SFT1}$ and $V_{SFT2}$ having an equivalent value to the power source voltage $V_{CC}$, for example, 5 V to respective gates of the input transistors N13 and N14. In this state, irrespectively of a difference between the inputs $V_{IN1}$ and $V_{IN2}$, the output voltages $V_{SFT1}$ and $VSFT_2$ become equivalent, the second input circuit 45 cannot compare the inputs $V_{IN1}$ and $V_{IN2}$ properly.

On the other hand, in the case where a common current source is used for the input circuits 44 and 45, and a common source is used for all the input transistors N11 through N14, the source potential $V_X$ becomes $V_{cc}-V_{thN}$. As a result, since the first input circuit 44 cannot ensure the threshold value voltage $V_{thN}$ of the input transistors N11 and N12, it cannot properly operate.

Therefore, in the case of using a common current source, if the input circuits 44 and 45 always operate, the upper limit value of the input dynamic range of the operational amplifier circuit 41 is restricted to be below the power source voltage $V_{CC}$ by the threshold voltage $V_{thP}$ of the MOS transistors P15 and P16.

In the present embodiment, respective current sources of the input circuits 44 and 45 are separately provided, and the source potential $V_{Xa}$ of the input transistors N11 and N12 and the source potential $V_{Xb}$ of the input transistors N13 and N14 vary separately. Therefore, even in the case where the common input voltage $V_{IN}$ increases to be more approximated to the power source voltage $V_{CC}$ than the shifted amount of the level shifters 47, the threshold value $V_{thN}$ of the input transistors N11 and N12 can be ensured. As a result, the first input circuit 44 can operate properly even when the common input voltage $V_{IN}$ is in the described range. On the other hand, in this state, in the second input circuit 45, the output voltages $V_{SFT1}$ and $V_{SFT2}$ of the level shifters 47 become the power source voltage $V_{CC}$ irrespectively of the inputs $V_{IN1}$ and $V_{IN2}$, and the current flowing through the input transistors N13 and N14 become equivalent. Therefore, the comparison current $I_{CMP}$ is controlled based on a current flowing through the input transistors N11 and N12 of the first input circuit 44. As a result, the differential input comparison circuit 42 outputs a comparison current $I_{CMP}$ based on inputs $V_{IN1}$ and $V_{IN2}$, and increases the upper limit value of the input dynamic range of the operational amplifier circuit 41 to the power source voltage $V_{CC}$.

In the arrangement of the present embodiment, explanations have been given through the case where the input transistor is the NMOS transistor, and a single input terminal is provided; however, the present invention is not limited to this arrangement. Needless to mention, as in the arrangements adopted in the first and second embodiments, the effects of the present embodiment can be ensured even when adopting the arrangement where the input transistor is constituted by the PMOS transistor, or it is switched among a plurality of input terminals.

[Fourth Embodiment]

In the output buffer circuit 3 (13) adopted in the first through third embodiments, the output is driven in one direction, the ability of driving the output deviates. Specifically, in the case of adopting the output buffer circuit 3 shown in FIG. 1, between the MOS transistors P31 and N32, the MOS transistor P31 serves as the main driving output element, and the MOS transistor N32 serves as an output load element for supplying a predetermined current to the MOS transistor P31. As a result, when lowering the output voltage $V_{OUT}$, the amplitude of the output current extracted from the output terminal OUT by the MOS transistor N32 is restricted, and a long time is required for extracting the current to the GND level. Therefore, in practical applications, when driving the load to be connected to the output terminal OUT, normally, a circuit for discharging the external load is required separately such as a discharge-use transistor, etc., to extract the current from the output terminal OUT.

In the output buffer circuit 13 shown in FIG. 6, the transistor which constitutes the circuit has a polarity opposite to the polarity of the output buffer circuit 3, and the MOS transistor N31 serves as the main driving output element, and the MOS transistor P32 serves as an output load element. Therefore, for example, the pre-charger-use transistor, etc., a circuit for charging an external load beforehand is separately required.

In any of the output buffer circuit 3(13), due to deviations in output driving capacity, a circuit for charging/discharging the external load beforehand is needed separately. Further, an additional time is required for charging/discharging. Additionally, in order to control the discharge-use transistor or the pre-charger-use transistor, it is required that the output buffer circuit 3(13) outputs a control signal, and a number of terminals of the operational amplifier circuit 1(11) increases.

Additionally, deviations in output driving capacity can be suppressed by increasing the current supplied from the MOS transistor N32(P32) which serves as a constant current source. However, this current always flows even while the output is being kept. Therefore, a new problem arises in that the power consumption of the operational amplifier circuit 1 (11) significantly increases.

Figure 15:
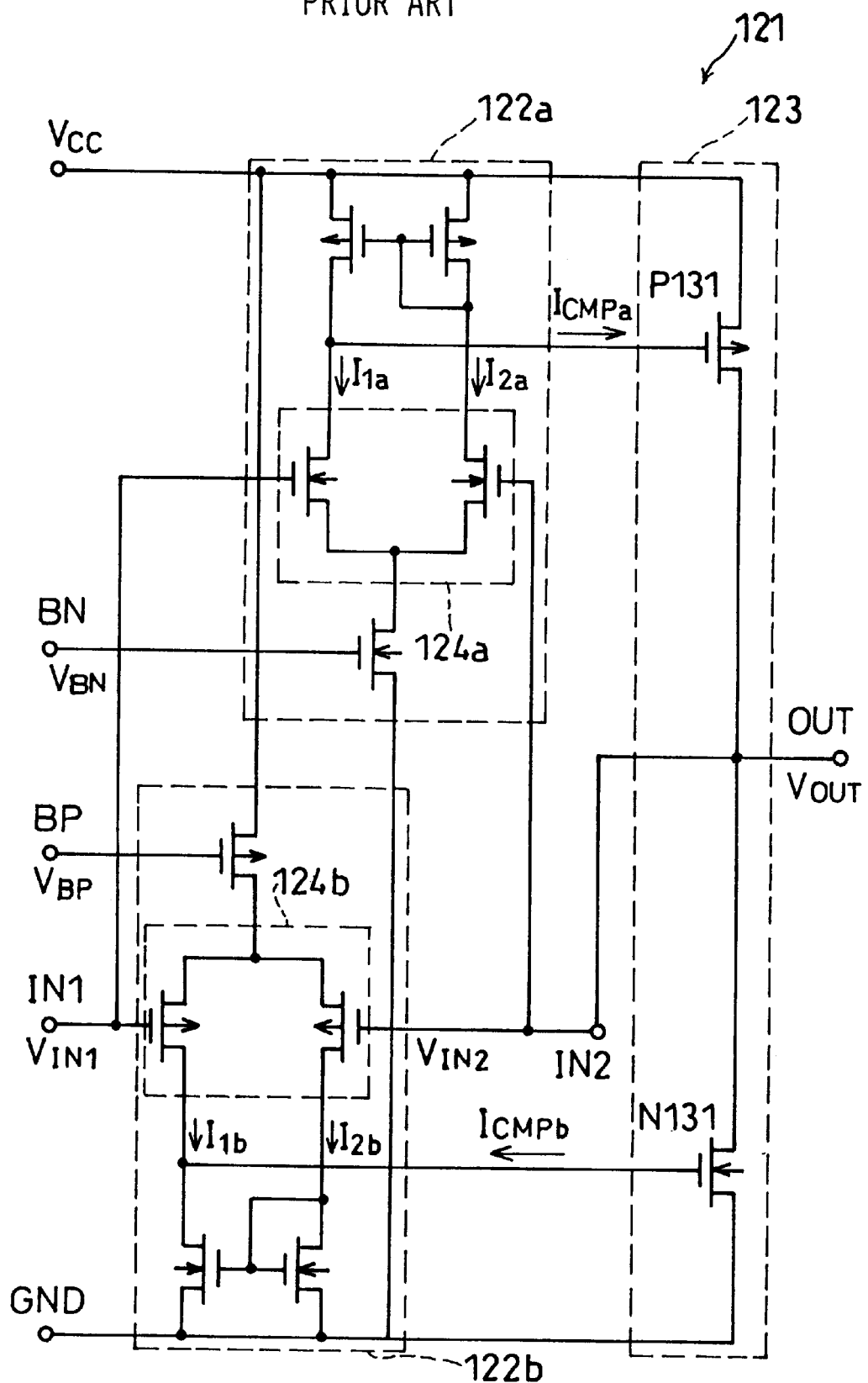
FIG. 15 is a circuit diagram showing essential parts of the conventional operational amplifier circuit.

In the conventional output buffer circuit 123 shown in FIG. 15, as the MOS transistors P131 and N131 drive the outputs bi-directionally, deviations in driving capacity do not occur. However, in this case, in order to drive the MOS transistors P131 and N131, the comparison currents $I_{CMPa}$ and $I_{CMPb}$ which flow bi-directionally are required. As a result, the input dynamic range of the operational amplifier circuit 121 is restricted as described above.

Figure 11:
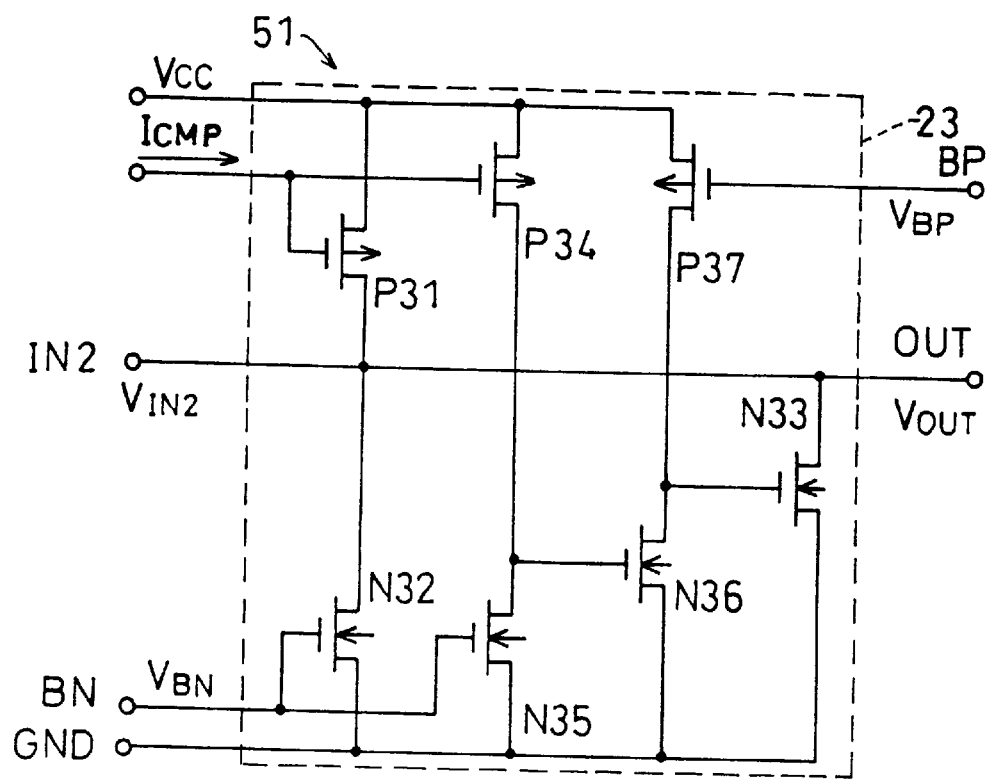
FIG. 11 is a circuit diagram showing an output buffer circuit of an operational amplifier circuit in detail in accordance with the fourth embodiment of the present invention.

In contrast, in the operational amplifier circuit 51 in accordance with the present embodiment, for example, as shown in FIG. 11, in replace of the output buffer circuit 3 adopted in each of the described embodiments, an output buffer circuit 23 that can drive the output bi-directionally according to an instruction of a single comparison current $I_{CMP}$ is adopted. In any of the arrangements of the operational amplifiers 1, 21 and 41 adopted in the described embodiments, the output buffer circuit 23 in accordance with the present embodiment can be replaced with the output buffer circuit 3. The following explanations will be given through the case where the output buffer circuit 23 is used in replace of the output buffer circuit 3 of the operational amplifier circuit 1 shown in FIG. 1. The arrangements of other members than the output buffer circuit 3, such as the differential input comparison circuit 2, etc., are the same as those of the aforementioned embodiment, and thus the descriptions thereof shall be omitted here.

In addition to the MOS transistors P31 and N32 having the same arrangement as the output buffer circuit 3, the output buffer circuit 23 includes an MOS transistor N33 as the fourth output transistor, and MOS transistors P34, N35, N36 and P37 as driving circuits for driving the MOS transistor N33 according to the comparison current $I_{CMP}$.

Additionally, the MOS transistors P31 and N32 respectively correspond to the third and fifth output transistors as defined in claims. As a result, the output buffer circuit 23 can drive the output voltage $V_{OUT}$ bi-directionally, i.e., directions of increasing and decreasing the output voltage $V_{OUT}$ according to the comparison current $I_{COM}$ supplied to the output buffer circuit 23.

Specifically, the P-type MOS transistor P34 and the N-type MOS transistor N35 are arranged such that respective drains are mutually connected. To the gate of the MOS transistor P34, the comparison current $I_{CMP}$ is applied, and to the gate of the MOS transistor N35, a predetermined bias voltage $V_{BN}$ is applied from the bias terminal BN. To the source of the MOS transistor P34, the power source voltage $V_{CC}$ is applied, and the source of the MOS transistor N35 is connected to ground.

The N-type MOS transistor N36 and the P-type MOS transistor P37 are arranged such that respective drains are connected, and the sources are kept at the ground potential GND and the power source voltage $V_{CC}$ respectively. Furthermore, the gate of the MOS transistor N36 is connected to a junction between the MOS transistors P34 and N35 in the pre-stage. Additionally, to the gate of the MOS transistor P37, a predetermined bias voltage $V_{BP}$ is applied from the bias terminal BP.

Further, a junction between the MOS transistors N36 and P37 is connected to the gate of the MOS transistor N33. Additionally, the MOS transistor N33 is arranged such that the drain is connected to the output terminal OUT, and the source is connected to ground.

Additionally, the input section of the output buffer circuit 23, i.e., the MOS transistors P31 and P34 wherein respective gates are connected are arranged so as to set a ratio of current flowing therein to be a predetermined ratio based on a ratio of an area of the transistor. In the present embodiment, the area of the MOS transistor P31 is selected to be twice as large as that of the MOS transistor P34, and a current value flowing through the MOS transistors P31 and P34 is selected to be 2:1. Additionally, in the MOS transistors N32 and N35, which serve as the constant current source of the MOS transistors P31 and P34, for example, based on respective transistor area ratio and the bias voltage $V_{BN}$, current values to be supplied from the MOS transistors N32 and N35 are selected to be 4 $\mu$A and 1 $\mu$A respectively. Additionally, the ratio of the area of the transistor and the current value can be set according to the use and are not limited to the above values.

In the described arrangement, an operation of the output buffer circuit 23 for driving a load will be explained as follows. As shown in FIG. 1, the differential input comparison circuit 2 adjusts an amount of a comparison current $I_{CMP}$ based on a difference between an inverting input $V_{IN1}$ and a non-inverting input $V_{IN2}$ so as to control respective gate potentials of the MOS transistors P31 and P34 which serve as an input section of the output buffer circuit 23. Further the MOS transistors P31 and P34 increase or decrease currents to be output based on the resulting gate potential. On the other hand, the MOS transistors N32 and N35 which are respectively connected to the MOS transistors P31 and P34 always supply a current of a predetermined value. According to the described arrangement, in the case where a difference between the inputs $I_{IN1}$ and $V_{IN2}$ is a predetermined value such as the case where the non-inverting input $V_{IN1}$ is equivalent to the inverting input $V_{IN2}$, the current to be output from the MOS transistor P31 balances with the current to be taken in the MOS transistor N32, i.e., a stable state.

In this stable state, a current of 4 $\mu$A flows in the MOS transistor P31 in the same amount as the current flowing in the MOS transistor P32. On the other hand, the MOS transistor P34 has a common gate with the MOS transistor P31, and an area thereof is ½ of the area of the MOS transistor P31, and thus the MOS transistor P34 outputs a current of 2 $\mu$A. Therefore, the current becomes larger than the current (1 $\mu$A) that is always absorbed by the MOS transistor N35. This causes an increase in a potential of a junction between the MOS transistors P34 and N35, i.e., the gate potential of the MOS transistor N36. As a result, the MOS transistor N36 conducts, and the gate potential of the MOS transistor N33 is lowered, thereby cutting off the MOS transistor N33. In this state, the MOS transistor N33 cuts off, and the MOS transistors P31 and N32 balance with each other. Therefore, the output buffer circuit 23 does not supply an output current from the output terminal OUT, and nor increase/decrease the output voltage $V_{OUT}$.

As shown in FIG. 2, an operational amplifier circuit 51 in accordance with the present embodiment is arranged such that an output terminal OUT and an inverting input terminal IN2 are connected to constitute a voltage follower (negative feedback circuit). Therefore, for example, in the case where the output voltage $V_{OUT}$ is undesirably lowered due to variations in external load (not shown) connected to the output terminal OUT, a current is output from the output terminal OUT to the external load to increase the output voltage $V_{OUT}$.

Specifically, the differential input comparison circuit 2 shown in FIG. 1 reduces a comparison current $I_{CMP}$ in accordance with a drop in output voltage $V_{OUT}$, i.e., inverting input $V_{IN2}$. As a result, in the output buffer circuit 23, the respective gate potentials of the MOS transistors P31 and P34 become lower than the potential in the stable state and the current flowing in the MOS transistors P31 and P34 increase. On the other hand, the current taken in by the MOS transistors N32 and N35 is kept constant.

In this state, as the MOS transistor 35 does not absorb current from the MOS transistor P34 completely as in the stable state, the MOS transistor N33 cuts off. On the other hand, unlike the stable state, the MOS transistor N32 does not absorb current output from the MOS transistor P31 completely. Therefore, the remaining current without being absorbed is supplied to the external load via the output terminal OUT. As a result, the output buffer circuit 23 releases the current as output to the external load to increase the output voltage $V_{OUT}$.

In contrast, in the case where the output voltage $V_{OUT}$ undesirably increases due to variations in external load, etc., the operational amplifier 51 takes in a current from an external load to lower the output voltage $V_{OUT}$. Namely, as the differential input comparison circuit 2 increases the gate potential of the MOS transistors P31 and P34, in the output buffer circuit 23, the current flowing in the MOS transistors P31 and P34 reduces as compared to the stable state.

In this state, the current supplied from the MOS transistor P31 is less than the current (4 $\mu$A) always absorbed by the MOS transistor N32. Therefore, the MOS transistor N32 takes in a current in short from the external load, and the output voltage $V_{OUT}$ is driven in a reducing direction.

On the other hand, the MOS transistor P34 outputs a current to the MOS transistor N35 in a half amount of the MOS transistor P31. Therefore, the MOS transistor N33 cuts off while the current being supplied from the MOS transistor P34 becomes lower than 1 $\mu$A, i.e., while the current being supplied from the MOS transistor P31 becomes lower than 2 $\mu$A. As a result, an amount of current to be output from the output terminal OUT is controlled with extremely high precision based on only an amount of current flowing in the MOS transistor P31.

Furthermore, when an amount of current the MOS transistor P34 supplies is reduced to be lower than the current (1 μA) supplied from the MOS transistor N35, a potential of a junction between the MOS transistors P34 and N35, i.e., a gate potential of the MOS transistor N36 is lowered, thereby cutting off the MOS transistor N36. As a result, the MOS transistor N33 conducts and absorbs a current from the external load.

Consequently, when the output buffer circuit 23 drives the output voltage $V_{OUT}$ in the reducing direction, an output current that can be absorbed by the output terminal OUT is significantly improved as compared to the case of adopting the MOS transistor N32 only (4 μA), and can be set in the same amount as that when releasing the output current. As a result, different from the output buffer circuit 3 shown in FIG. 1, deviations in output driving capacity can be prevented.

In the present embodiment, the current to be supplied from the MOS transistor N35 is set to 1 μA; however, the present invention is not limited to this. It should be noted here that if the current value is too small, a noise margin is reduced, which may cause an operation error. On the other hand, if the current value is too large, a current consumption increases or a chip size increases. Therefore, in view of a typical leak current, it is desirable that the current value is not less than a nanoampere (nA) order.

Figure 12:
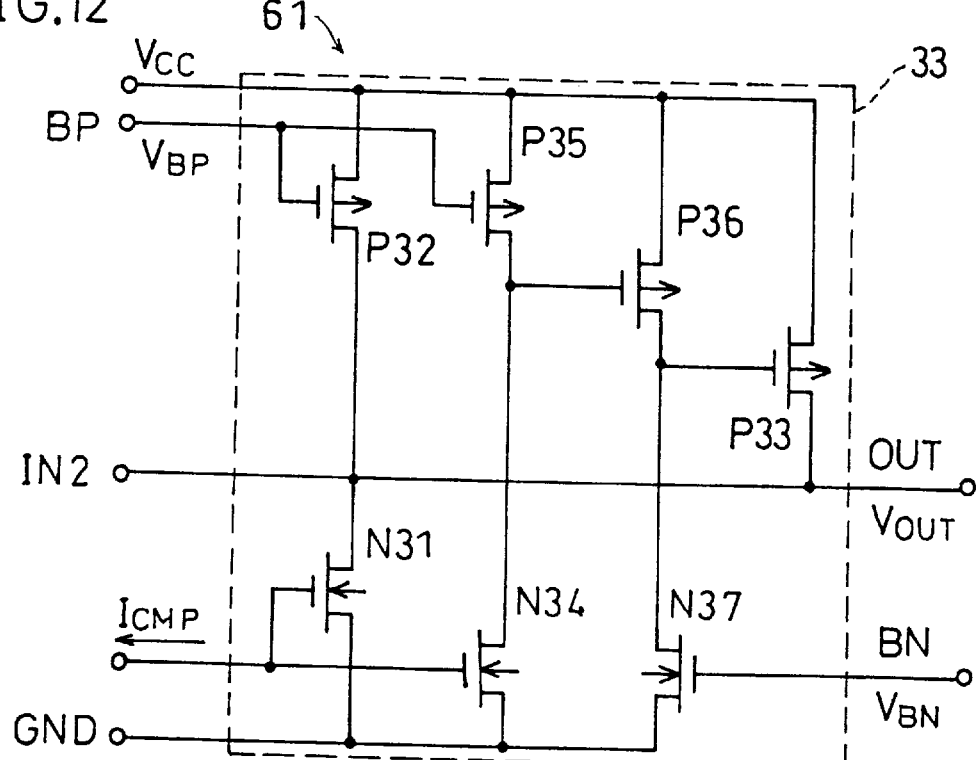
FIG. 12 is a circuit diagram showing an output buffer circuit in detail in accordance with one modified example of the operational amplifier circuit.
Figure 13:
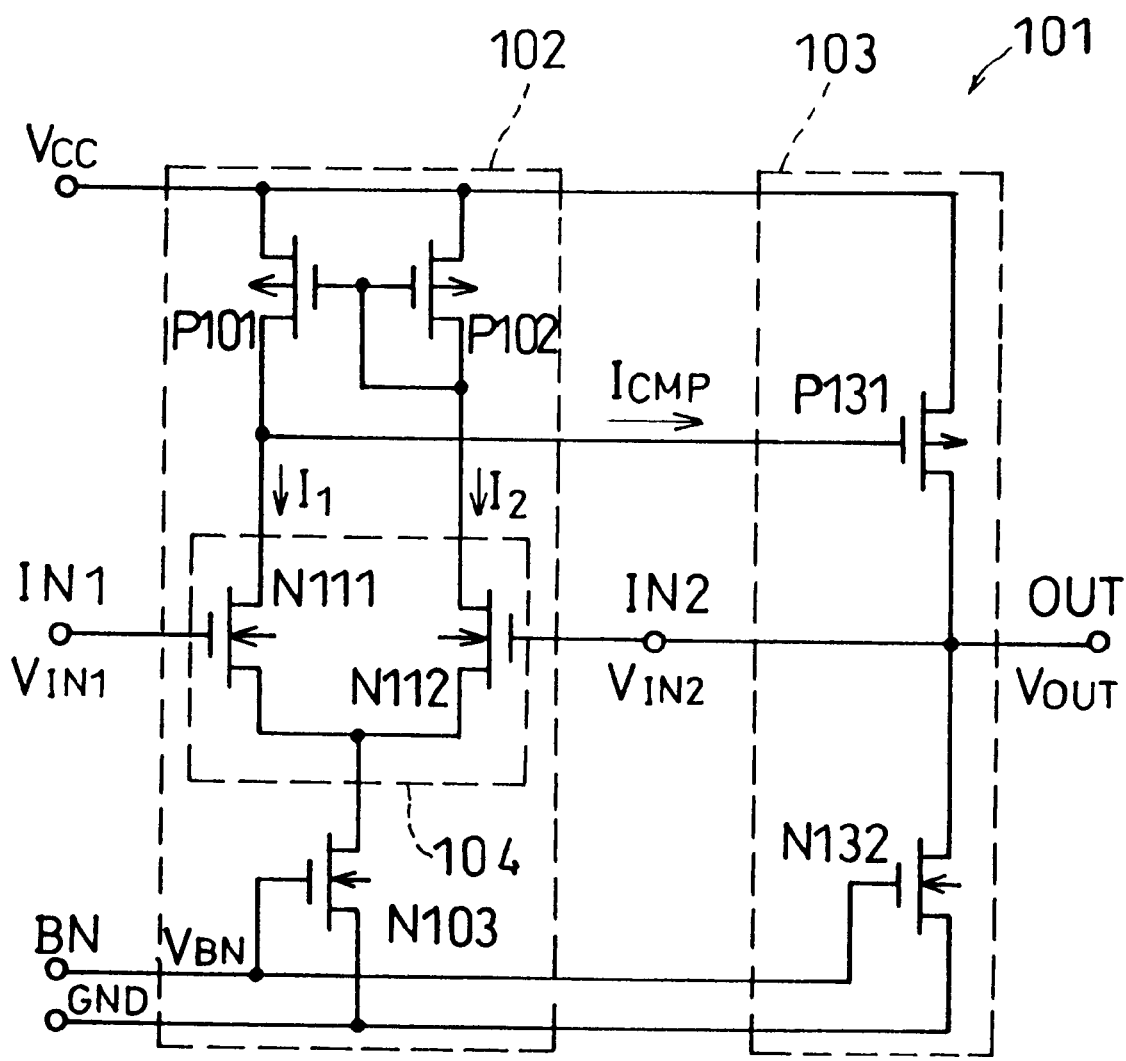
FIG. 13 is a circuit diagram showing essential parts of conventional operational amplifier circuit.
Figure 14:
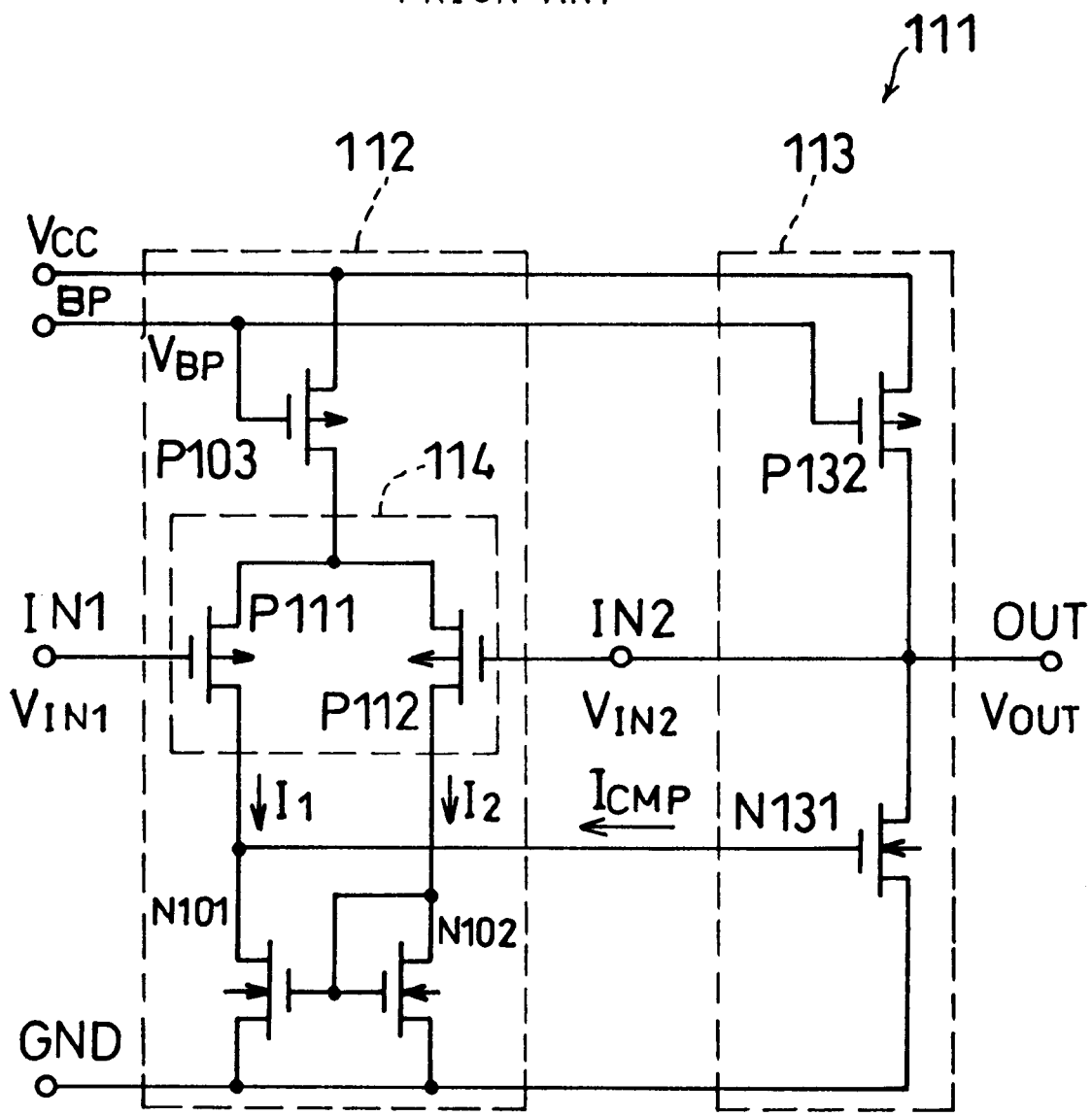
FIG. 14 is a circuit diagram showing essential parts of conventional operational amplifier circuit.

In reference to FIG. 11., explanations have been given through the case where the comparison current $I_{CMP}$ is supplied to the output buffer circuit 23, i.e., in the case of adopting N-type transistor for each of the input transistors N11 through N14 of the differential input comparison circuit 2. However, the same effect can be achieved from the arrangement of adopting the P-type transistor. In this case, in replace of the output buffer circuit 13 in accordance with the first through third embodiments, the output buffer 33 shown in FIG. 12 is adopted. Here, the output buffer circuit 33 is arranged such that the PN polarities of all the MOS transistors have opposite polarities to those of the output buffer circuit 23, and the power source voltage $V_{CC}$ and the ground potential GND are switched, and the respective positions of applying the bias voltages $V_{BP}$ and $V_{BN}$ are switched. Other arrangements of the output buffer circuit 33 such as a connection of each MOS transistor, etc., are the same as the output buffer circuit 23. Additionally, the circuit is operated by reversing only the polarity of, for example, a power source. Therefore, in FIG. 12, the PMOS transistors having the same functions as MOS transistor N33 shown in FIG. 11 are designated by the same reference numerals and only the reference characters are changed between P and N, and thus the descriptions thereof shall be omitted here.

As described, the operational amplifier circuit 1 (11, 21, 31 and 41) in accordance with first through fourth embodiments includes a level shifter for shifting the inputs $V_{IN1}$ and $V_{IN2}$ in the same amount in the direction of a predetermined operation region in the case where inputs $V_{IN1}$ and $V_{IN2}$ are in inoperable region. Hereinafter, for convenience in explanations, members having the same functions as aforementioned embodiments will be designated by the reference numerals applied to the corresponding members appeared first, and only when it is necessary to distinguish, explanations will be given, for example, in reference to the figure.

For example, in the case of the operational amplifier circuit 1 shown in FIG. 1, an operation region is set in a range of $V_{thN}<V_{IN}<V_{cc}$, and the inoperable region is set in a range of $V_{IN}<V_{thN}$. Therefore, the direction to be input in the operation region, the direction of increasing the inputs $V_{IN1}$ and $V_{IN2}$, and in the case where the inputs $V_{IN1}$ and $V_{IN2}$ are in the inoperable region, the shift register 7 increases the inputs $V_{IN1}$ and $V_{IN2}$ by a predetermined amount of shift. As described, the first differential amplifier (operational amplifier circuit 1) wherein a non-inverting input to be applied to the non-inverting input terminal is compared with an inverting input to be applied to the inverting input terminal, and in order to solve the described problem, it is characterized by including a differential amplifier section (differential input comparison circuit 2) for comparing the inputs when the input voltage falls in a predetermined operable region and a level shifter (7) for shifting the potentials of the inputs by a predetermined amount in a direction of inputting into the operational region when the input voltage falls in the inoperable region outside the operable region.

In the differential amplifier section, a range in which the non-inverting input and the inverting input can be compared is generally determined by the structure of the circuit of the differential amplifier section. Normally, the range is limited to a range narrower than the range of the power source voltage by the threshold voltage of the transistor, base-emitter voltage, etc.

In contrast, in the described arrangement, the operable region of the differential amplifier section is set beforehand within the described range. For example, in the case where the differential amplifier section is constituted by the MOS transistor, and the input section for converting each input voltage into a current is constituted by a circuit in a single input direction of the N channel, the operable region of the differential amplifier section is restricted to a range of from the threshold value voltage of the MOS transistor to the power source voltage. In this case, for example, the range of from the threshold value voltage to the power source voltage is set as an operable region, and the region of not more than the threshold value voltage is set as an inoperable region. The operable region is determined by the structure of the differential amplifier section, and the operable region is determined within the described range, and this can be said for other arrangements than the described arrangement.

In the case where the input voltage of the differential amplifier is in the operable region, the differential amplifier section is operable for sure, and the differential amplifier can compare the non-inverting input and the inverting input without problems. On the other hand, when the input voltage is raised or lowered and is deviated from the operable region, the level shifter shifts the potential of both inputs by a predetermined amount in a direction of entering the input voltage to the operable region. Therefore, the distance between the input voltage and the operable region is within an amount of shift by the level shifter, both potentials are adjusted to fall in the operable region, and the differential amplifier section can compare both inputs without problems.

Therefore, in the differential amplifier, the operable range of an input voltage, i.e., the input dynamic range is increased by an amount of shift of the level shifter. Additionally, when the level shifter applies an input voltage after being level shifted to the circuit in the post stage of the level shifter when the input voltage is in the inoperable region. As a result, these circuits operate in the same manner as when the input voltage is increased or decreased by an amount of shift of the level shifter. Therefore, even when adopting the conventional circuits, the input dynamic range can be increased by an amount of shift of the level shifter. As a result, the differential amplifier having a wide dynamic range can be achieved by using a transistor having the conventional characteristics such as a transistor of an enhancement type.

According to the described arrangement, an element which requires a special manufacturing process such as a depletion mode MOS transistor, etc., can be eliminated, an improved integration of the differential amplifier circuit can be achieved. Furthermore, the differential amplifier can be manufactured in the same manufacturing process as other circuits, it can be easily mixed with these circuits, and an improved integration of a circuit including a differential amplifier can be achieved.

According to the described first through fourth embodiments, the gate of the detection-use transistor N41 is connected to the inverting input terminal IN2 (output terminal OUT), and based on the inverting input $V_{IN2}$, it is determined if the common input voltage $V_{IN}$ is in the operable region. However, the present invention is not limited to the described arrangement. Needless to mention, even when the operation region is determined based on the non-inverting input $V_{IN1}$ and the common input voltage $V_{IN}$, the same effects can be achieved.

Then, the operational amplifier circuit 1 in accordance with first through fourth embodiments includes the first input circuit 4 for directly converting the inputs $V_{IN1}$ and $V_{IN2}$ into currents and the second input circuit 5 having the level shifters 7, for converting the inputs $V_{IN1}$ and $V_{IN2}$ into currents $I_1$ and $I_2$ as level shifted. However, the present invention is not limited to the described arrangement.

For example, it may be arranged such that an input section for converting both inputs into current is provided, and switching elements are formed respectively between the non-inverting input terminal and the input section and the inverting input terminal and the input section and further between the level shifter and the input section, and the conducting and cutting-off of the switching elements are controlled depending on if the input voltage is applied in the operable region to enlarge an input dynamic range of the operational amplifier circuit. However, when adopting the described arrangement, due to a drop in voltage in the switching element, an application voltage to the differential amplifier section may be restricted.

In contrast, as shown in each embodiment, in the second differential amplifier (operational amplifier circuit 1) of the present invention, the differential amplifier section is characterized by including: a first input section (first input circuit 4) having a first input transistor (N11) for controlling an amount of current passing therethrough based on a non-inverting input and a second input transistor (N12) for controlling an amount of current passing therethrough based on an inverting input; a second input section (second input section 5) having third and fourth input transistors (N13, N14) for respectively controlling amounts of currents passing therethrough based on the non-inverting input and the inverting input applied through the level shifter, the third and fourth input transistors respectively having same polarities as first and second input transistors; and an output section (output buffer circuit 3) for outputting a voltage according to a difference between a sum of an amount of currents flowing in the first and third input transistors and a sum of an amount of currents flowing in the second and fourth input transistors. The second differential amplifier of the present invention is also arranged such that each level shifter in the second differential amplifiers arranged so as to shift potentials of both inputs in a direction of increasing an amount of current flowing in the third and fourth input transistors.

According to the described arrangement, in the first input section, a difference between the current flowing through the first input transistor and the current flowing through the second input transistor varies depending on the non-inverting input and the inverting input. Additionally, the level shifter shifts both inputs for the same amounts, and in the second input section, a difference in current flowing through both of the third and fourth input transistors varies according to both inputs. The first through fourth input transistors have the same polarity. As a result, to a difference between a sum of the currents flowing in the first and the third input transistor and a sum of the currents flowing in the second and the fourth input transistor, a difference in voltage between the inputs is reflected. Furthermore, the output section outputs a voltage according to the difference in amount of currents.

For example in the case where an input voltage is applied to an inoperable region, etc., if respective threshold voltages of the first and second input transistors cannot be ensured, the first and second input transistors cut off. In this case, the difference in amount of currents is equivalent to a difference between a current flowing in the third input transistor and the current flowing in the fourth input transistor. As a result, if at least one input section is operated, the differential amplifier can compare the non-inverting input and the inverting input based on a difference in current.

Furthermore, as each input transistor has the same polarity, the direction of the flow of the current is the same, and for example, by connecting the terminals corresponding to the input transistors such as input transistors N11 and N13 on the non-reverting input side, and input transistors N12 and N14 on the inverting input side, etc., the sum of currents can be computed. As described, the respective outputs from both of the input sections can be synthesized with ease, a differential amplifier which offers a wider input dynamic range than the conventional differential amplifier can be achieved with a simple structure.

Additionally, as each input transistor has the same polarity, the input sections can be connected to a common active load (MOS transistors P1 and P2). As a result, the differential amplifier section generates a comparison current having a single direction indicative of the difference in current irrespectively of an amplitude of the common input voltage to instruct a difference between the non-inverting input and the inverting input to the output section.

Additionally, in the described arrangement, as each input terminal can be directly connected to the first and second input transistors, the switching element, etc., can be eliminated, thereby preventing a problem that the input dynamic range is restricted due to a drop in voltage of the switching element. Therefore, compared with the case where the switching element is provided, the input dynamic range of the differential amplifier can be still increased. Additionally, as an occurrence of an error due to variations in the switching element can be prevented, improved characteristics of the differential amplifier can be achieved.

In the first through fourth embodiments, explanations have been given through the case where the active load composed of the MOS transistors P1 and P2 is connected to the input circuits 4 and 5; however, the present invention is not limited to this. For example, it may be arranged such that the resistors are respectively connected to the input transistors N11 and N13 on the non-inverting input side and the input transistors N12 and N14 on the inverting input side. As respective voltages between terminals can be varied based on currents $I_1$ and $I_2$ flowing through resistors, the operational amplifier circuit can output the output voltage $V_{OUT}$ according to a difference in currents $I_1$ and $I_2$.

Furthermore, as explained in the first through fourth embodiments, the third differential amplifier of the present invention based on the arrangement of the second differential amplifier in accordance with the present invention is characterized in that an amount of shift of the level shifters is selected to be not less than an amount of drop in voltage of the first through fourth input transistors.

In the case where the differential amplifier section has the first through fourth input transistors, the operable range of the differential amplifier section becomes narrower than the range of the power source voltage for an amount of drop in voltage in the first through fourth input transistors. However, according to the described arrangement, as the level shifter increases the input dynamic range to compensate for the reduction in the input dynamic range, the input dynamic range of the differential amplifier can be increased to the entire range of the power source voltage.

Additionally, as explained in the first through fourth embodiments, in the fourth differential amplifier of the present invention, the differential amplifier having the arrangement of the second or third differential amplifier is characterized in that the level shifter includes a shift amount increase use current source (MOS transistors P45 and P46) for biasing respective input potentials in a direction of increasing currents in the third and fourth input transistors by supplying a predetermined current; and a shift amount control-use transistor (MOS transistor P15 and P16) having opposite polarity to that of the first through fourth input transistors, which conducts when an amount of shift of the level shifter exceeds a predetermined value to limit an increase in the amount of shift.

According to the described arrangement, an amount of shift of the level shifter can be determined by a shift amount control-use transistor having an opposite polarity to the first through fourth input transistor. The shift amount control-use transistor is manufactured in the same process as each input transistor, and, for example, only by adjusting the length or the shape of each input transistor and the amount of shift of the control-use transistor, a drop in voltage of the first through fourth input transistors can be set equivalent to an amount of shift relatively with ease. As a result, for example, compared with the case of constituting the level shifter using a resistor, etc., a level shifter having a desirable amount of shift can be achieved in a simpler manner.

However, like the conventional arrangement, in the case where the input circuit 124a has an N-type transistor, and the input circuit 124b has a P-type input transistor are provided (see FIG. 15), the respective directions of the currents $I_1$ and $I_2$ corresponding to the inputs $V_{IN1}$ and $V_{IN2}$ differ between the input circuit 124a and the input circuit 124b by an input circuit. Therefore, an active load is required for each input circuit, and two comparison currents $I_{CMPa}$ and $I_{CMPb}$ are generated. Therefore, it is required for the output buffer circuit 123 to synthesize the comparison currents $I_{CMPa}$ and $I_{CMPb}$ by a push-pull operation to generate an output voltage $V_{OUT}$.

In this case, in the output buffer circuit 123, the high level of the output voltage $V_{OUT}$ is restricted by an operable region of the MOS transistor P131 to which the comparison current $I_{CMPa}$ is applied, while the low level is restricted by an operable region of the MOS transistor N131 to which a comparison current $I_{CMPb}$ is applied. Therefore, the output dynamic range of the operational amplifier circuit 121 becomes narrower than the range of the power source.

In contrast, the respective input transistors N11 through N14 in accordance with the present embodiment have the same polarity, and the respective directions of the currents $I_1$ and $I_2$ are the same irrespectively of which one of the first and second input circuits 4 and 5 is operated. Therefore, both of the input circuits 4 and 5 can be connected to a common active load (MOS transistor P1, P2). As a result, the differential input comparison circuit 2 is permitted to instruct a difference between the inputs $V_{IN1}$ and $V_{IN2}$ based on a single comparison current $I_{CMP}$ irrespectively of the common phase input voltage $V_{IN}$.

Furthermore, as explained in each of the first through fourth embodiments, the fifth differential amplifier in accordance with the present invention based on the arrangement of the second, third or fourth differential amplifier is characterized in that the output section includes the first output transistor (MOS transistor P31) for controlling an amount of current passing therethrough based on a comparison current indicative of the difference in the amount of current, and the second output transistor (MOS transistor N32) having a different polarity from that of the first output transistor for supplying a predetermined current to the first output transistor.

According to the described arrangement, the first output transistor controls an amount of current passing therethrough based on the comparison current. On the other hand, the second output transistor always supplies a current in a constant amount irrespectively of whether or not the first and second input sections are operated. Therefore, in the conventional push-pull system, like the case of synthesizing the outputs from two input sections, an output voltage can be generated without being affected by the effects from the input section which is not operated. As a result, compared with the conventional example, the output dynamic range can be increased.

In the output section provided in the fifth differential amplifier in accordance with the present invention, has a constant current supply from the second output transistor, an amount of current that can be supplied to the output terminal is limited to be smaller than the current that can be supplied to the output terminal of the differential amplifier. As a result, a deviation in output driving capacity of the output section occurs between the case of increasing the output and the case of reducing the output. Therefore, irrespectively of the driving direction, in the case of driving the output at high speed, an additional circuit is separately required for charging/discharging a load beforehand. This increases a required number of circuits to be added to the external section of the differential amplifier such as a pre-charging circuit, or a discharging circuit, etc., and also requires an additional operation time for discharging. Additionally, the differential amplifier is required to output the control signal in order to instruct the additional circuits for charging/discharging, which results in an increase in the number of the terminals of the differential amplifier.

In contrast, as explained in the fourth embodiment, the sixth differential amplifier of the present invention based on the arrangement of the second, third or fourth differential amplifiers, the output section (output buffer circuit 23) includes the third and forth output transistors (MOS transistors P31·N33) capable of driving respective outputs in mutually different directions according to a comparison current indicative of a difference in the amount of current, and driving circuit (MOS transistors P34, N35, P36 and N37) for driving at least one of the output transistors between the third and fourth output transistors based on the comparison current.

As in the described arrangement, the first input section and the second input section compare the non-inverting input and the inverting input in the wider input dynamic range than the conventional arrangement to supply a comparison current according to the difference between the inputs to the output section. On the other hand, at least one of the third and the fourth output transistors drives an output from the differential amplifier in a direction corresponding to the output transistor between the increasing direction and the reducing direction according to the instruction from the driving circuit. In the case where the driving circuits do not drive both of the output transistors, the output transistor which is not driven controls an amount of a current passing therethrough based on the comparison current to drive the output from the differential amplifier in the corresponding direction.

Therefore, the output section can drive the output in both directions based on the single comparison current, thereby achieving a differential amplifier which offers a wide input/output dynamic range and prevents a deviation in output driving capacity. Furthermore, the differential amplifier is permitted to drive the load of the differential amplifier without charging/discharging beforehand. As a result, even when driving an output at high speed irrespectively of a driving direction, as signal lines to be instructed to a circuit for charging/discharging and a signal line for use in instructing to the circuit can be eliminated, thereby achieving a simplified circuit structure as compared to the fifth differential amplifier. Additionally, as a time for charging/discharging beforehand is not needed, a still improved operation rate of the differential amplifier can be achieved.

Additionally, according to the arrangement of the fourth embodiment, the comparison current $I_{CMP}$ directly drives the MOS transistor P31, and the driving circuit drives the MOS transistor N33 based on the comparison current $I_{CMP}$; however, the present invention is not limited to this arrangement. The method of controlling the output transistor by the driving circuit are not particularly limited, various method may be adopted.

For example, it may be arranged such that the driving circuit respectively drives the MOS transistors P31 and N33 based on the comparison current $I_{CMP}$. However, different from the output buffer circuit 123 shown in FIG. 15, only a single comparison current $I_{CMP}$ is generated, such driving circuit is not permitted to drive the MOS transistors P31 and N33. Therefore, the same effect as achieved from the present embodiment can be achieved from the arrangement wherein the driving circuit drives at least one of the MOS transistors P31 and N33.

According to the arrangement of the fourth embodiment, the driving circuit cuts off the MOS transistor N33 while the current flowing through the MOS transistor P31 exceeds a predetermined value. However, the present invention is not limited to this, and for example, it may be arranged so as to always control a current flowing through the MOS transistor N33. Then, upon giving an instruction to maintain the output voltage $V_{OUT}$, such as the case where the inverting input and the non-inverting input coincide, an amount of currents flowing through the MOS transistors P31 and N33 is controlled to set the current to be input and output in and from the output terminal OUT to 0. As a result, it is difficult to maintain the precision in maintaining the output voltage.

In contrast, as explained in the fourth embodiment, the seventh differential amplifier of the present invention based on the sixth differential amplifier is characterized in that the output section has the fifth output transistor (MOS transistor N32) having a different polarity from the third output transistor, for supplying a predetermined current to the third output transistor, wherein the third output transistor controls an amount of current passing therethrough based on the comparison current, and the driving circuit cuts off the fourth output transistor while an amount of current flowing in the third output transistor exceeds a predetermined value set to a value smaller than an amount of current the fifth output transistor supplies.

According to the described arrangement, as the fourth output transistor cuts off while an output is being driven in a direction corresponding to the third output transistor, the third output transistor is permitted to drive the output in the corresponding direction without being disturbed by the fourth output transistor. The fourth output transistor cuts off also in the case where the output section receives an instruction to maintain an output. Therefore, in this case also, the current to be input/output in or from the output terminal of the differential amplifier can be determined only based on a current flowing through the third output transistor.

Furthermore, in the case where the current flowing in the third output transistor reduces below a predetermined value, the driving circuit conducts the fourth output transistor. As a result, a current to be flown from the output terminal of the differential amplifier, or a current to be flown therein increase.

As described, the fourth output transistor cuts off while the third output transistor is driving the output voltage and a driving capacity of the second output transistor is in sufficient. Therefore, during the period, the current to be input and output from the output terminal OUT is controlled based on the current flowing through the third output transistor. As a result, compared with the case of controlling the third and fourth output transistors, the output voltage can be driven with ease and accuracy. Additionally, in the case where the current flowing through the third output transistor exceeds a predetermined value, the fourth output transistor conducts to increase the output driving capacity.

Therefore, while maintaining the precision in maintaining the output voltage at the same level as the conventional arrangement, an output driving capacity in a direction corresponding to the fourth output transistor can be improved, thereby preventing a deviation in output driving capacity.

By the way, according to the respective arrangements of the second through seventh differential amplifiers, in the case where the first input section and the second input section are operated, compared with the case of operating only either one of them, power consumption increases. Furthermore, due to an adverse effect from one output to the other, an error may be increased, or a proper operation may not be ensured.

For example, in each input section, in the case where the input voltage is applied in a vicinity of a boundary between an operable region and an inoperable region, only one of a pair of the input transistors may conduct. In this case, a difference between the non-inverting input and the inverting input does not reflect the difference in current flowing in a pair of input transistors, and the differential amplifier may not be able to compare both of the inputs properly.

As in the arrangements adopted in the first and second embodiments, in the case of adopting a common current source (MOS transistor N4) to bias the first through fourth input transistors, the output potential of the current source (potential $V_x$ at a junction between the MOS transistor N4 and respective input transistors N11 through N14) varies depending on an output from the level shifter.

Therefore, in the case where the input voltage is in an end of an operable region of the second input section, and when the output from the level shifter is close to the power source voltage or the ground voltage, the input of the first input section is approximated to the output potential of the power source, and the first and second input transistors cannot conduct. As a result, the first input section may not be operated, and the input dynamic range of the differential amplifier is restricted undesirably.

For example, in the operational amplifier circuit 1 shown in FIG. 1, a potential difference between the inputs $V_{IN1}$ and $V_{IN2}$ and the power source voltage $V_{CC}$ is smaller than an amount of shift of the level shifter 7, in the second input circuit 5, the output voltages $V_{SFT1}$ and $V_{SFT2}$ of the level shifter 7 is restricted by the power source voltage $V_{CC}$ irrespectively of the inputs $V_{IN1}$ and $V_{IN2}$, and the second input circuit 5 may not be operated. On the other hand, the inputs $V_{In1}$ and $V_{IN2}$ are approximated to the potential $V_X$, and the input transistors N11 and N12 may not conduct. As a result, the first input circuit 4 cannot operate, thereby presenting the problem that the input dynamic range of the operational amplifier circuit 1 is restricted undesirably.

In contrast, as explained in the first and second embodiments, the eighth differential amplifier of the present invention based on the arrangement of the second, third, fourth, fifth, sixth or seventh differential amplifier is characterized by including a selection circuit (switch circuit 6) for selectively operating the first and second input sections depending on if the input voltage is applied to the operable range.

According to the described arrangement, only one of the input sections is operated based on an instruction from the selection circuit. Therefore, a power supply to the other input section can be stopped, and compared with the case of operating both of the input sections simultaneously, a power consumption of the differential amplifier can be reduced. Furthermore, in the case where the operation of one input section is unstable, for example, when the input voltage is applied to the end of the proper operable region of the input section, the selection circuit is permitted to operate the other input section, thereby achieving still improved characteristics of the differential amplifier.

Additionally, like the operational amplifier 1 adopted in the first and second embodiments, in the case where the current source is used in common between the input circuits 4 and 5, a sum of the currents $I_1$ and $I_2$ is determined based on an amount of current the current source supplies. Therefore, irrespectively of which of the input circuits 4 and 5 is operated, respective comparison current $I_{CMP}$ corresponding to the inputs $V_{IN1}$ and $V_{IN2}$ are substantially the same, and an operation speed of the operational amplifier circuit 1 can be adjusted. Additionally, even in the case where an operation of one of the input circuits 4 and 5 is unstable, the other input circuit can be operated by stopping the input circuit. As a result, an error in the operational amplifier circuit 1 is reduced, thereby achieving still improved characteristics.

Additionally, as explained in the first and second embodiments, the ninth differential amplifier of the present invention based on the eighth differential amplifier is characterized in that the differential amplifier section includes a common constant current source (MOS transistor N4) for supplying a bias current of the first through fourth input transistor, and the level shifter includes a shift amount increase-use current source (MOS transistors P45·P46) which permits respective input potentials can be biased in respective directions of increasing currents flowing in the third and fourth input transistors and a shift amount reduction-use current source (MOS transistors N3 and N5) for biasing respective input potentials in directions of reducing currents flowing through in the third and fourth input transistors by supplying a predetermined current, and a shift amount control-use transistor (MOS transistors P15 and P16) for controlling an amount of shift by conducting when an amount of shift of the level shifter exceeds a predetermined value, the shift amount control-use transistor having opposite polarity to the first through fourth input transistors, and the selection circuit includes a detecting section (6a) for instructing to the shift amount increase-use current source for a stoppage of the current apply when the input voltage is in an operable region.

According to the described arrangement, when the input voltage is in the operable region, a shift amount increase-use current source stops a supply of current based on an instruction from the detection section. In this state, the level shifter cannot maintain a desirable amount of shift, and currents flowing through the third and fourth input transistors is limited based on the bias current of the shift amount reduction-use current source. As a result, the second input section cannot be operated, and the output section controls the output voltage based on a difference in current flowing in the first and second input transistors.

On the other hand, in the case where the input voltage is applied to the inoperable region, the shift amount increase-use current source supplies a current, and the level shifter applies the inputs after being level shifted to the third and fourth input transistors. In this state, the output potential of the constant current source provided in common among the first through fourth input transistors varies depending on the inputs after being level shifted. As a result, a potential difference between both inputs before being level shifted and the output potential becomes small, and the first and second input transistors may not conduct. Therefore, the first input section cannot be operated, and the output section controls the output current based on a difference between the current flowing in the third and the fourth input transistors.

Therefore, in the differential amplifier having the described arrangement, as the detection section controls ON/OFF of the operation of the shift amount increase-use current source, the input sections can be switched. Therefore, compared with the case of separately controlling ON/OFF of the operation of the input sections, for example, by providing the switching element, etc., a simplified structure of the differential amplifier can be achieved. Furthermore, in the operable region, as the operation of the level shifter is stopped, a power consumption can be reduced.

Additionally, as explained in the first and second embodiments, the tenth differential amplifier of the present invention based on the eighth differential amplifier is characterized in that the selection circuit includes a detection-use transistor (N41) for detecting the inoperable region based on an application voltage to the input transistor, having the same arrangement as at least one of the first through fourth input transistors. According to the described arrangement, as the input transistor and the detection-use transistor mutually have the same structure with regard to the shape, size, impurity density, etc., they can be manufactured in the same process, thereby permitting the circuit to be integrated with ease as compared to the case where the determination is made using transistors having different structures. Therefore, for example, even if the characteristics of the input transistor vary due to variations in manufacturing process, ambient temperature, etc., characteristics of the detection-use transistor also vary. Additionally, an application voltage to the input transistor is the same as an application voltage to the detection-use transistor. As a result, even when an inoperable region of the input transistor varies due to changes in characteristics of the input transistor, the selection circuit can surely detect the inoperable region.

However, as explained in the first and second embodiments, the eighth through tenth differential amplifiers include a selection circuit in order to avoid an interference between the first input section and the second input section. For such selection circuit, for example, a member (detecting section 6a) having a detection-use transistor is provided, for determining if an input voltage is applied to an inoperable region, and a member (constant current source 6b) for stopping the non-selected input section such as a member for stopping a supply of current to the level shifter, etc., are provided. Therefore, it is likely that the circuit structure of the differential amplifier becomes more complicated compared to the conventional arrangement.

In contrast, as in the third embodiment, in the eleventh differential amplifier of the present invention having an arrangement of the second, third, fourth, fifth, sixth or seventh differential amplifier, the differential amplifier section is characterized by including the first constant current source (MOS transistor N4a) for supplying a bias current of the first and second input transistor, and the second constant current source (MOS transistor N4b) for supplying the bias current of the third and fourth input transistors. Additionally, each constant current source can be formed, for example, by a transistor wherein a predetermined voltage is applied to a base, a gate.

According to the described arrangement, as the first and second constant current sources for the first and second input sections are separately provided, a generation of the described interference does not occur, and both of the first and second input sections can be operated simultaneously without problems. Additionally, these first and second constant current sources are enabled, for example, by a circuit of a very simple structure such as an MOS transistors N4a, N4b, etc. Therefore, compared with the case of providing the selection circuit like the eighth through tenth differential amplifiers, the number of elements of the differential amplifier can be reduced, thereby achieving a still more simplified circuit structure.

As explained in the second embodiment, the twelfth differential amplifier of the present invention based on any one of the first through eleventh differential amplifiers, at least one of the non-inverting input terminal and the inverting input terminal is formed in a plural number, and includes an input switch (switching-use transistor N21a, N21b, P23a, P23b) for selecting one of input terminals as an input of the differential amplifier section.

According to the described arrangement, the input switch, for example, includes a switching element for conducting/cutting off according to a signal to be applied to the control terminal, and selects one of the inputs to be applied to the input terminal by cutting off between other input terminals than the selected input terminal and the corresponding input transistor, or the current flowing in non-selected transistors. As a result, the differential amplifier selects one of a plurality of inputs, and based on the selected input, the non-inverting input can be compared with the inverting input.

Additionally, in the operational amplifier circuit 21 in accordance with the second embodiment, two terminals IN1a and IN1b are provided on the non-inverting input side; however, the number of the terminals is not limited to this. As long as a plurality of terminals are formed, the effects as achieved from the present embodiment can be achieved.

Additionally, in the second embodiment, in order to feed back the output voltage $V_{OUT}$, the inverting input terminal IN2 is used, and only one inverting input terminal IN2 is formed. However, the present invention is not limited to this arrangement. It may be arranged so as to include a plurality of inverting input terminals IN2, and a signal to be applied to one of the input terminals IN2 may be selected as the inverting input $V_{IN2}$. In this case, it may be also arranged so as to provide the same circuit as the non-inverting input side on the inverting input side of each input circuits 24 and 25 (34 and 35). The same effects as achieved from the arrangement where one of the inverting input terminal or the non-inverting input terminal or both of the input terminals are provided.

However, in the case where one of the non-inverting input side and the inverting input side has a plurality of input terminals, and the other has a single input terminal, like the operational amplifier circuit 21 in accordance with the second embodiment, it is preferable to form the MOS transistors N22 and P24 also on the single input side. The MOS transistors N22 and P24 have the same arrangements of switching-use transistors N21a, N21b, P23a and P23b and always conduct. As a result, the non-inverting input side and the inverting input side can balance with each other, and an error in the operational amplifier can be still reduced.

In the respective arrangements of the first and fourth embodiments, the voltage follower circuit is constituted by connecting the inverting input terminal IN2 of the operational amplifier circuit and the output terminal OUT. However, the present invention is not limited to the described arrangement. Each of the described differential amplifiers is suited for use in various circuits such as an adder circuit, a filter, etc.

Among them, the voltage follower circuit including a negative feed back circuit constituted by connecting the inverting input terminal to the output terminal of any one of the differential amplifiers among the first through twelfth differential amplifiers is especially preferable.

Namely, in general, when constituting the voltage follower circuit, the input dynamic range is restricted by the output dynamic range. Therefore, like the conventional arrangement of generating the output voltage $V_{OUT}$ by the push-pull system, when the output dynamic range becomes narrower, the input dynamic range also becomes narrower.

However, any of the first through twelfth differential amplifiers permits both the input dynamic range and the output dynamic range to be increased to the entire range from the ground level GND to the power source voltage $V_{CC}$, thereby achieving the voltage follower circuit having a wide input dynamic range which offers excellent effects.

The operational amplifier circuit adopted in the first through fourth embodiments is formed by integrating the MOS transistor; however, the present invention is not limited to this. The same effects can be achieved by adopting other transistor such as a J-FET (junction electric field effect transistor), or a bipolar transistor, etc.

Similarly, in each of the described embodiments, explanations have been given through the case where the operational amplifier is constituted by using the differential amplifier. However, the present invention is not limited to this. The differential amplifier is applicable to various other circuits such as the comparator circuit, etc., as long as the inputs V$IN1$ and $V_{IN2}$ can be compared. Furthermore, in each of the described embodiments, a TFT liquid crystal driver is adopted as an example of the device adopting the operational amplifier circuit. However, the present invention is not limited to this, and is applicable to various other devices as well. It should be noted, however, that as the dynamic range can be increased in both of the input and output, power consumption can be reduced. Furthermore, an improved operation speed can be achieved by driving the load bi-directionally. Therefore, when applying the operational amplifier circuit to such device that requires many operational amplifier circuits, and is driven using battery, such as for example, like the TFT liquid crystal driver, etc., effects as achieved from the present invention are especially appreciated. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A differential amplifier which compares a non-inverting input to be applied to a non-inverting input terminal with an inverting input to be applied to an inverting input terminal, comprising:

a differential amplifier section for comparing the inverting input and the non-inverting input when an input voltage is in a predetermined operable region;

a plurality of level shifters for shifting respective potentials of the inverting input and the non-inverting input by the same amount in directions so as to allow the input voltage to fall in the operable region when the input voltage is in an inoperable region outside the operable region; and a switching circuit for controlling the level shifters so as to make them operable or inoperable based upon whether or not the input voltage is in the operable region.

2. A differential amplifier which compares a non-inverting input to be applied to a non-inverting input terminal with an inverting input to be applied to an inverting input terminal, comprising:

a first input section having a first input transistor for controlling an amount of current flowing there through based on the non-inverting input and a second input transistor for controlling an amount of current flowing therethrough based on the inverting input;

a second input section having third and fourth input transistors for controlling respective amounts of currents flowing therethrough based on the non-inverting input and the inverting input to be applied through said level shifter, said third and fourth input transistors respectively having the same polarities as the first and second input transistors;

an output section for outputting a voltage according to a difference between a sum of currents flowing through said first and third input transistors and a sum of currents flowing through said second and fourth input transistors, and a plurality of level shifters for shifting respective potentials of the inverting input and the non-inverting input by the same amount in directions so as to increase the currents flowing through the third and fourth input transistors.

3. The differential amplifier as defined in claim 2, wherein:

an amount of shift by each of said level shifters is selected to be not less than an amount of drop in voltage in said first through fourth input transistors.

4. The differential amplifier as defined in claim 2, wherein each of said level shifters includes:

a shift amount increasing-use power source for biasing respective input potentials in a direction of increasing currents flowing in said third and fourth input transistors by supplying a predetermined current; and shift amount controlling-use transistor having an opposite polarity to that of said first through fourth input transistors for restricting an increase in an amount of shift by conducting when the amount of shift by said level shifter exceeds a predetermined value.

5. The differential amplifier as defined in claim 2, further comprising:

a current mirror circuit for supplying a comparison current resulting from comparing a sum of currents flowing in said first and third input transistors and a sum of currents flowing in said second and fourth input transistors.

6. The differential amplifier circuit as defined in claim 2, wherein said output section includes:

a first output transistor for controlling an amount of current passing therethrough based on a comparison current indicative of the difference in amount of currents; and a second output transistor having a different polarity from said first output transistor, for supplying a predetermined current to said first output transistor.

7. The differential amplifier as defined in claim 2, wherein said output section includes:

third and fourth output transistors for driving outputs in mutually different directions in response to a comparison current indicative of the difference in amount of currents; and a driving circuit for driving at least one of said third output transistor and said fourth output transistor based on the comparison current.

8. The differential amplifier as defined in claim 7, wherein:

said output section further includes a fifth output transistor for supplying a predetermined current to said third output transistor, said fifth output transistor having a different polarity from said third output transistor, said third output transistor controls an amount of current passing therethrough based on the comparison current, and said driving circuit cuts off said fourth output transistor while a current is flowing in said third output transistor in a larger amount than a predetermined value that is selected to be a value smaller than an amount of current supplied from said fifth transistor.

9. The differential amplifier as defined in claim 2, further comprising:

selection means for selectively operating one of said first and second input sections based on whether or not said input voltage is in the operable region.

10. The differential amplifier as defined in claim 9, further including a common constant current source for supplying a bias current to said first through fourth input transistors, and wherein each level shifter includes:

a shift amount increasing-use current source for biasing respective input potentials in a direction of increasing currents flowing in said third and fourth input transistors by supplying a predetermined current;

a shift amount reducing-use current supply line for biasing respective input potentials in a direction of reducing currents flowing in said third and fourth input transistors by supplying a predetermined current; and a shift amount controlling-use transistor for controlling an amount of shift by conducting when the amount of shift by each level shifter exceeds a predetermined value, said shift amount controlling-use transistor having an opposite polarity to said first through fourth input transistors, and said selection means includes a detecting section for instructing said shift amount increasing-use current source to stop a supply of current when the input voltage is in the operable region.

11. The differential amplifier as defined in claim 9, wherein:

said selection means includes a detection-use transistor for detecting the inoperable region based on a voltage to be applied to said input transistor, said input transistor having the same structure as at least one of first through fourth input transistors.

12. The differential amplifier as defined in claim 2, wherein said differential amplifier section includes :

a first constant current source for supplying a bias current of said first and second input transistors; and a second constant current source for supplying a bias current of said third and fourth input transistors.

13. The differential amplifier as defined in claim 1, wherein:

at least either the non-inverting input terminal or the inverting input terminal is formed in a plurality number; and an input switching device is provided for selecting one of inputs to respective input terminals as an input of said differential amplifier section.

14. The differential amplifier as defined in claim 2, wherein:

at least either the non-inverting input terminal or the inverting input terminal is a single common input terminal, and the other is formed in a plural number as selective input terminals, and a plurality of input transistors on the selective input terminal side, said input transistors being said first or second input transistors, are formed in parallel to each other so as to correspond to respective selective input terminals, said differential amplifier further comprising:

a first switch formed at each input transistor, said first switch conducting when one of said selective input terminals is selected to supply a current to the corresponding input transistor, and a second switch formed in a same shape as said first switch, said second switch always conducting to supply a current to an input transistor on the side of said common input terminal.

15. The differential amplifier as defined in claim 4, wherein:

at least either the non-inverting input terminal or the inverting input terminal is a single common input terminal, and the other is formed in a plural number as selective input terminals, and a plurality of level shifters on the side of said selective input terminals are formed in parallel to each other so as to correspond to respective selective input terminals, each level shifter on the side of selective input terminals includes a third switch for supplying a current to a shift amount controlling-use transistor of the corresponding level shifter by conducting when one of the selective input terminals is selected, and a level shifter on the side of the common input terminal includes a fourth switch formed in a same shape as said third switch, said fourth switch always conducting to supply a current to said shift amount controlling-use transistor of the level shifter.

16. The differential amplifier as defined in claim 2, wherein:

said first through fourth input transistors are selected to have mutually the same characteristics by adjusting respective shapes, arrangements and impurity densities.

17. The differential amplifier as defined in claim 2, wherein:

said first through fourth input transistors are metal oxide semiconductor transistors.

18. A voltage follower circuit comprising a negative feed back circuit formed by connecting the inverting input terminal and the output terminal of said differential amplifier as defined in claim 1.

19. A voltage follower circuit comprising a negative feed back circuit formed by connecting the inverting input terminal and the output terminal of said differential amplifier as defined in claim 2.

20. A differential amplifier which compares a non-inverting input to be applied to a non-inverting input terminal with an inverting input to be applied to an inverting input terminal, comprising:

first through fourth FETs that have the same polarity with their sources being connected to each other;

a first level shifter for level-shifting an input potential of the non-inverting input terminal by a predetermined value so as to apply it to a gate of the third FET; and a second level shifter for level-shifting an input potential by the predetermined value so as to apply it to a gate of the second FET, wherein the first and third FETs have drains connected to each other, the second and fourth FETs have drains connected to each other, the first FET has a gate connected to the non-inverting input terminal, and the second FET has a gate connected to the inverting input terminal.

* * * * *